(12) United States Patent
Hong et al.

(10) Patent No.: US 12,051,697 B2
(45) Date of Patent: Jul. 30, 2024

(54) INTEGRATED CIRCUIT DEVICES INCLUDING STACKED GATE STRUCTURES WITH DIFFERENT DIMENSIONS

(71) Applicant: Samsung Electronics Co., Ltd., Suwon-si (KR)

(72) Inventors: Byounghak Hong, Albany, NY (US); Seunghyun Song, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 17/361,381

(22) Filed: Jun. 29, 2021

(65) Prior Publication Data

US 2022/0336456 A1 Oct. 20, 2022

Related U.S. Application Data

(60) Provisional application No. 63/176,492, filed on Apr. 19, 2021.

(51) Int. Cl.
| | | |
|---|---|---|
| *H01L 27/092* | (2006.01) | |
| *H01L 21/8238* | (2006.01) | |
| *H01L 25/07* | (2006.01) | |
| *H01L 27/06* | (2006.01) | |
| *H01L 29/06* | (2006.01) | |
| *H01L 29/423* | (2006.01) | |

(52) U.S. Cl.
CPC .... *H01L 27/0922* (2013.01); *H01L 21/82385* (2013.01); *H01L 25/074* (2013.01); *H01L 27/0688* (2013.01); *H01L 27/092* (2013.01); *H01L 29/0665* (2013.01); *H01L 29/0673* (2013.01); *H01L 29/42392* (2013.01)

(58) Field of Classification Search
CPC . H01L 27/0922; H01L 27/092; H01L 27/088; H01L 27/0688; H01L 21/8221; H01L 21/823842; H01L 21/82345; H01L 21/82385; H01L 21/823456; H01L 21/823864; H01L 21/823468; H01L 29/0665; H01L 29/0673; H01L 29/775; H01L 29/78696; H01L 29/42392
See application file for complete search history.

(56) References Cited

U.S. PATENT DOCUMENTS

| | | |
|---|---|---|
| 9,837,414 B1 | 12/2017 | Balakrishnan et al. |
| 9,991,261 B2 | 6/2018 | Mitard |
| 10,304,832 B1 | 5/2019 | Chanemougame et al. |
| 10,483,166 B1 | 11/2019 | Cheng et al. |
| 10,734,447 B2 | 8/2020 | Ando et al. |
| 2019/0196830 A1* | 6/2019 | Lilak ............... G06F 9/30036 |
| 2019/0393214 A1* | 12/2019 | Lilak ............ H01L 21/823431 |
| 2019/0393307 A1 | 12/2019 | Reznicek et al. |
| 2020/0006331 A1 | 1/2020 | Lilak et al. |
| 2020/0035569 A1* | 1/2020 | Frougier ......... H01L 21/823842 |
| 2020/0098859 A1* | 3/2020 | Reboh ............. H01L 29/42392 |
| 2020/0294866 A1* | 9/2020 | Cheng ............. H01L 21/28088 |
| 2020/0335501 A1 | 10/2020 | Dewey et al. |

(Continued)

*Primary Examiner* — Michael M Trinh
(74) *Attorney, Agent, or Firm* — Myers Bigel, P.A.

(57) ABSTRACT

Integrated circuit devices may include a lower transistor and an upper transistor stacked on a substrate, and the upper transistor may overlap the lower transistor. The upper transistor may include an upper gate structure, and the lower transistor may include a lower gate structure, and the upper gate structure and the lower gate structure may have different widths in a horizontal direction.

9 Claims, 21 Drawing Sheets

(56) References Cited

U.S. PATENT DOCUMENTS

2022/0013521 A1\*  1/2022  Zhang ............... H01L 21/02603
2022/0109046 A1\*  4/2022  Hong ................ H01L 29/78696
2022/0301936 A1\*  9/2022  Merchant .......... H01L 29/66553

\* cited by examiner

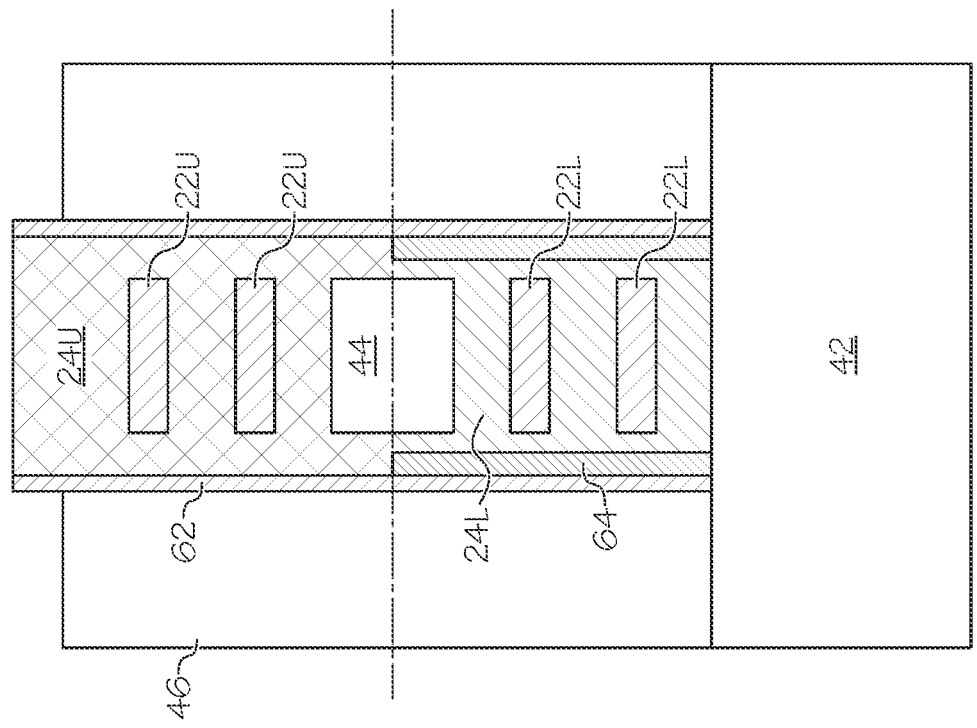
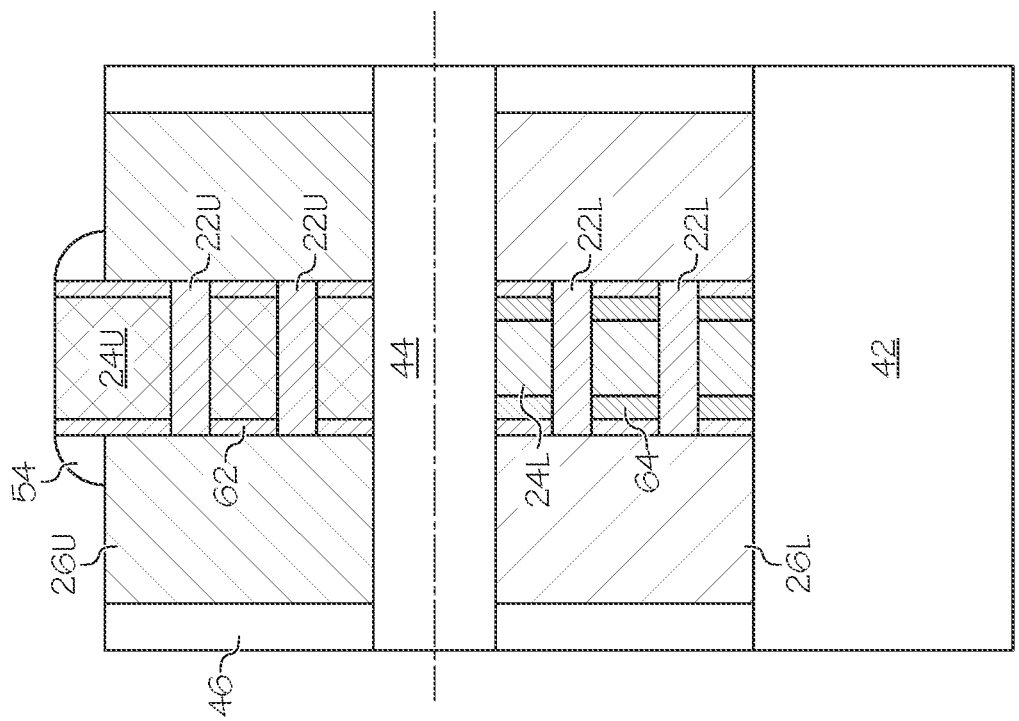
FIG. 6A
FIG. 6B

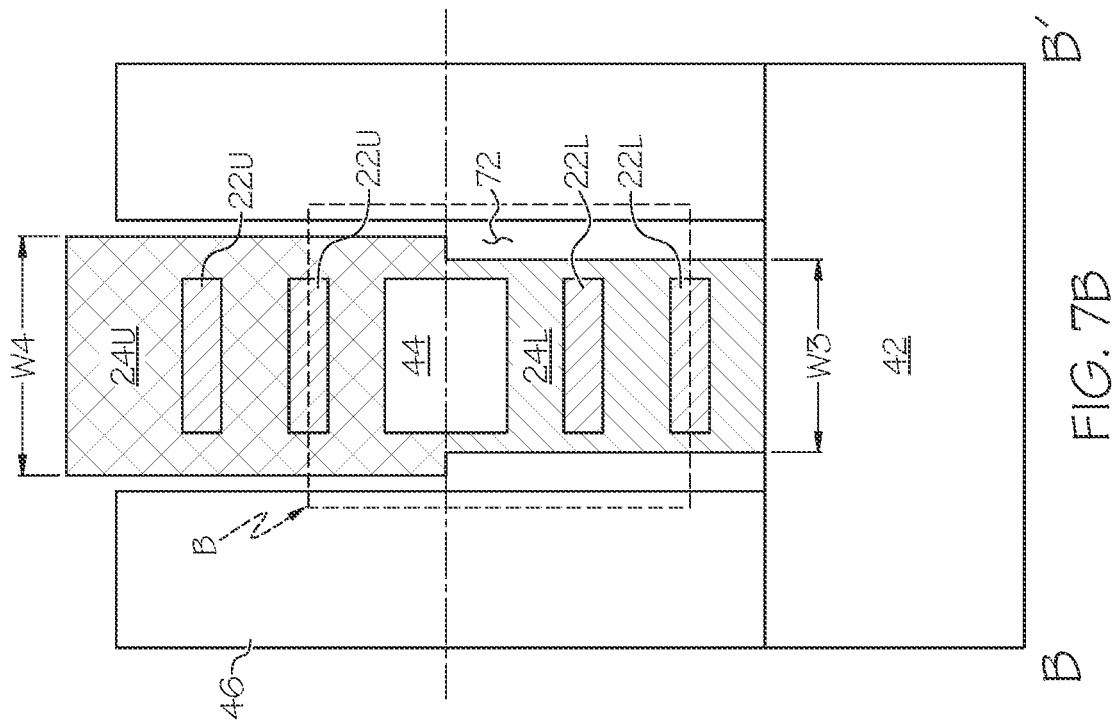
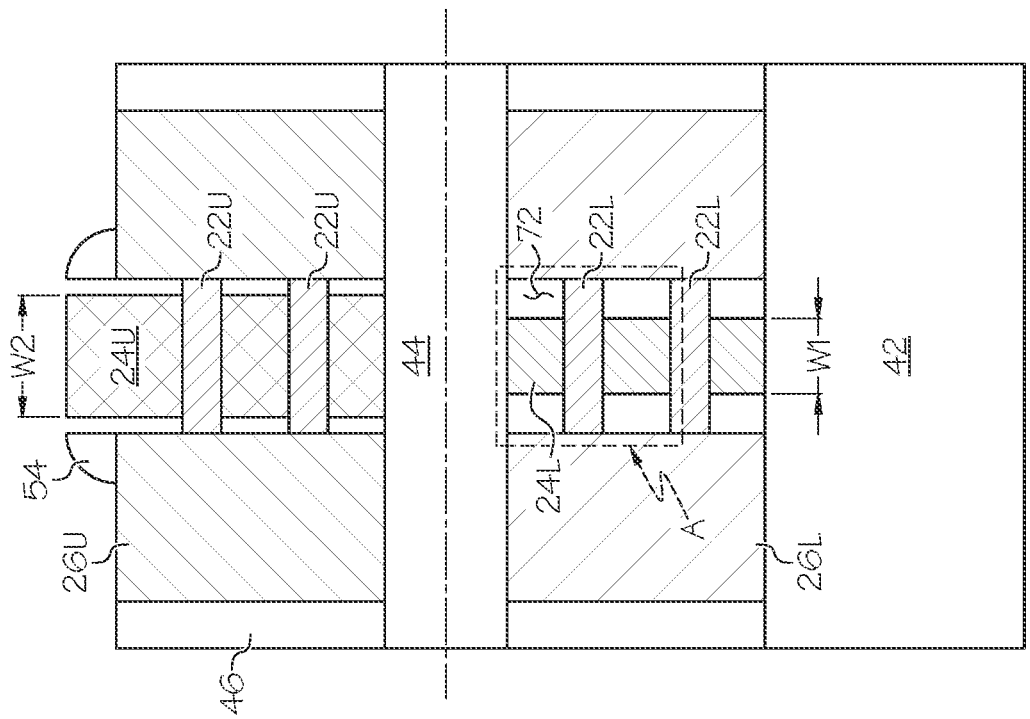
FIG. 7A
FIG. 7B

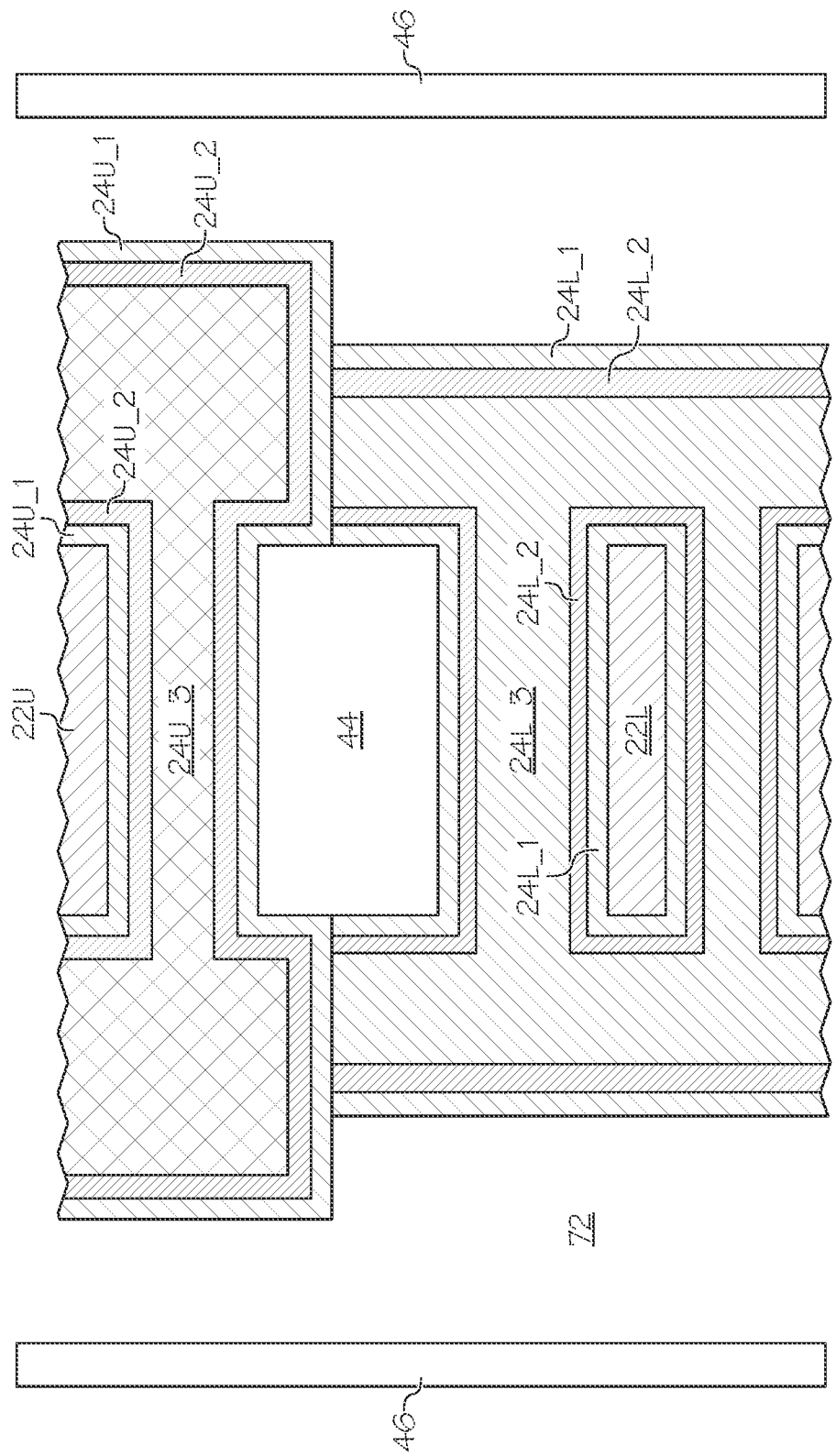

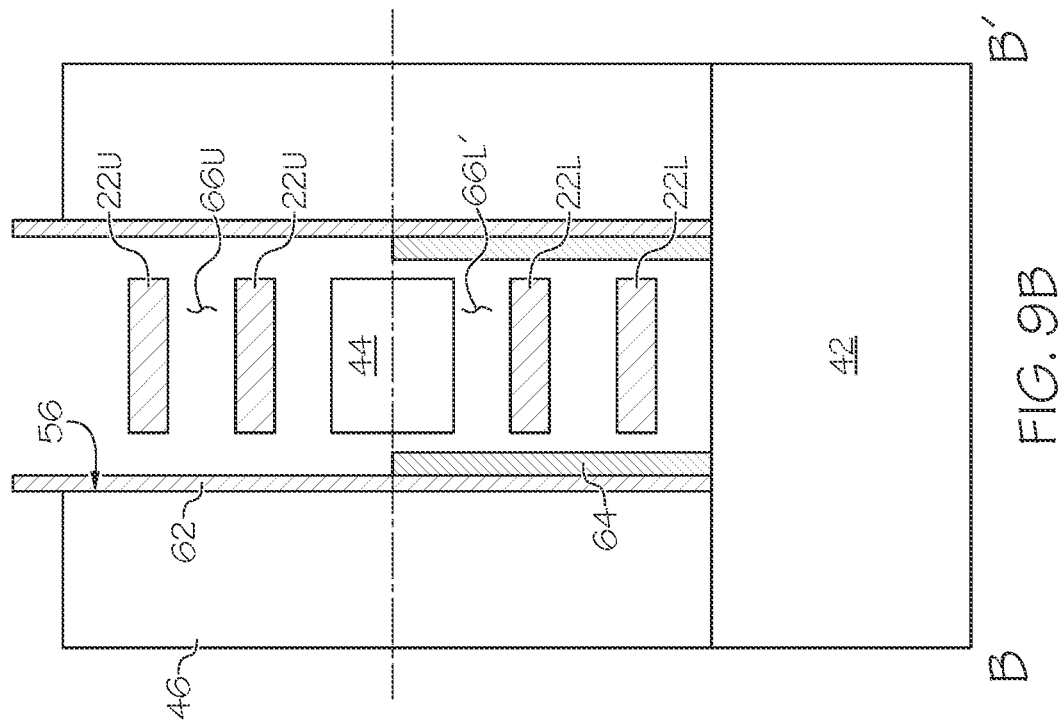
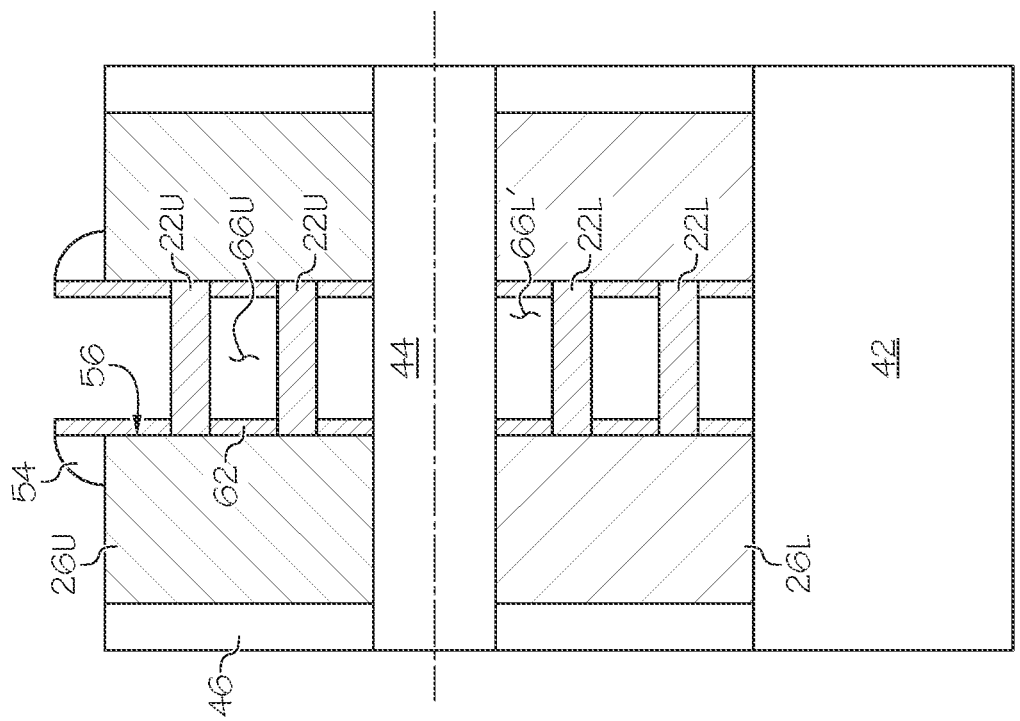

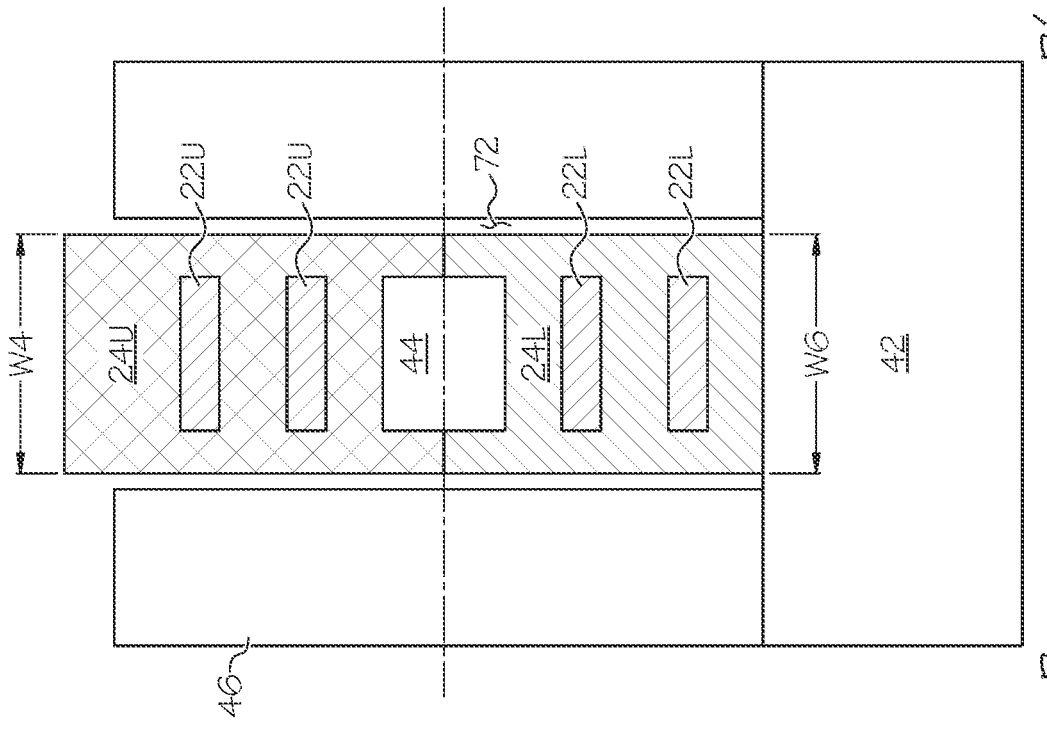
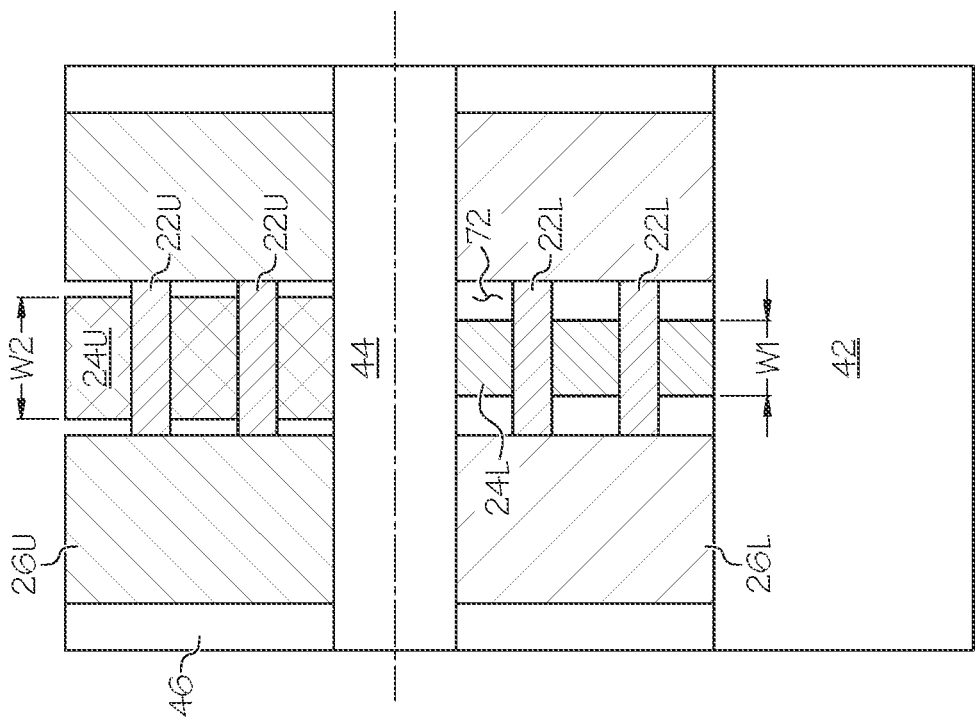
FIG. 12B
FIG. 12A

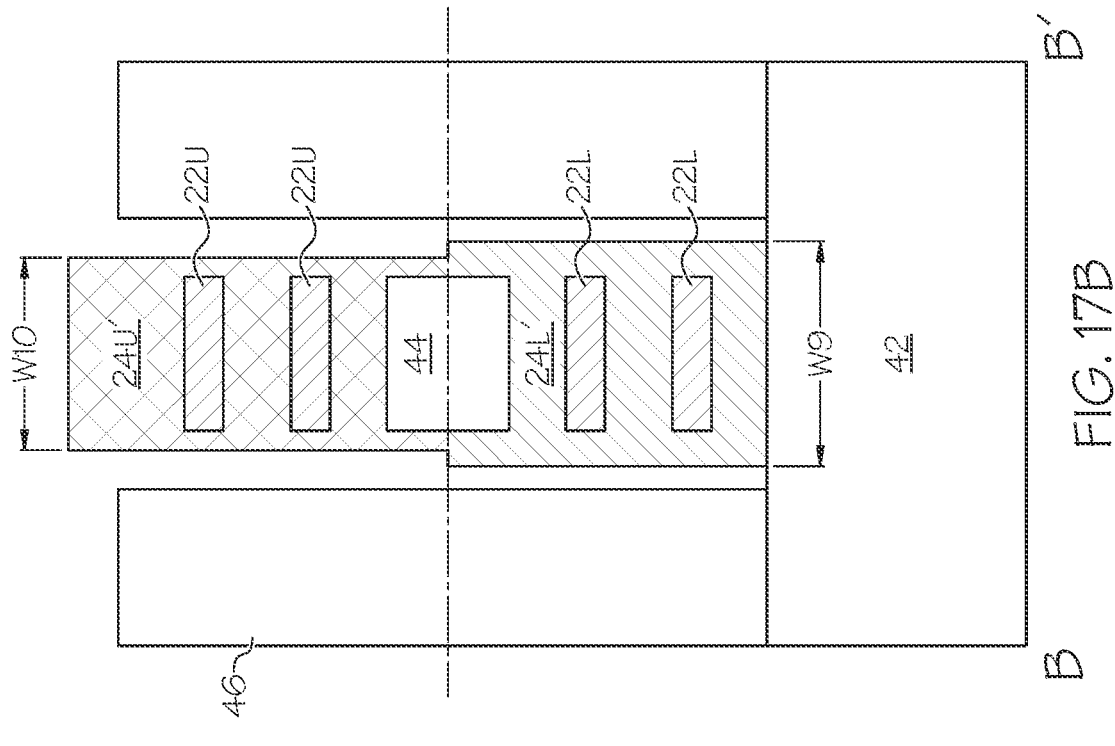

INTEGRATED CIRCUIT DEVICES INCLUDING STACKED GATE STRUCTURES WITH DIFFERENT DIMENSIONS

CROSS-REFERENCE TO RELATED APPLICATION

This application claims priority to U.S. Provisional Application Ser. No. 63/176,492, entitled T SHAPE OR ASYMMETRIC CHANNEL LENGTH DEVICE STRUCTURE FOR 3D STACKED CFET, filed in the USPTO on Apr. 19, 2021, the disclosure of which is hereby incorporated by reference herein in its entirety.

FIELD

The present disclosure generally relates to the field of electronics and, more particularly, to integrated circuit devices including stacked transistors.

BACKGROUND

An integrated circuit device including stacked transistors, such as a complementary field effect transistor (CFET) stack, was introduced to reduce its area to close to one-half of the area of a corresponding non-stacked device. However, an integrated circuit device including stacked transistors may include various stacked elements which may contribute to making a manufacturing process complex and challenging.

SUMMARY

According to some embodiments of the present inventive concept, integrated circuit devices may include an upper transistor on a substrate and a lower transistor between the substrate and the upper transistor. The upper transistor may include an upper active region, an upper gate structure on the upper active region, and first and second upper source/drain regions that are spaced apart from each other in a first horizontal direction and contact opposing side surfaces of the upper active region, respectively. The first horizontal direction may be parallel to an upper surface of the substrate. The lower transistor may include a lower active region, a lower gate structure on the lower active region, and first and second lower source/drain regions that are spaced apart from each other in the first horizontal direction and contact opposing side surfaces of the lower active region, respectively. The lower gate structure has a first width in the first horizontal direction, and the upper gate structure has a second width in the first horizontal direction. The lower gate structure has a third width in a second horizontal direction that may be perpendicular to the first horizontal direction and is parallel to the upper surface of the substrate, and the upper gate structure has a fourth width in the second horizontal direction. The first width may be different from the second width, or the third width may be different from the fourth width.

According to some embodiments of the present inventive concept, integrated circuit devices may include an upper transistor on a substrate and a lower transistor between the substrate and the upper transistor. The upper transistor may include an upper active region, an upper gate structure on the upper active region, and first and second upper source/drain regions that are spaced apart from each other in a first horizontal direction and contact opposing side surfaces of the upper active region, respectively. The first horizontal direction may be parallel to an upper surface of the substrate. The lower transistor may include a lower active region, a lower gate structure on the lower active region, and first and second lower source/drain regions that are spaced apart from each other in the first horizontal direction and contact opposing side surfaces of the lower active region, respectively. The lower gate structure has a first width in a second horizontal direction that may be perpendicular to the first horizontal direction and is parallel to the upper surface of the substrate, and the upper gate structure has a second width in the second horizontal direction, and the second width may be wider than the first width.

According to some embodiments of the present inventive concept, methods of forming an integrated circuit device may include forming a preliminary stacked structure that may include: first and second lower source/drain regions on a substrate and spaced apart from each other in a first horizontal direction that may be parallel to an upper surface of the substrate; a lower active region between the first and second lower source/drain regions and contacting the first and second lower source/drain regions; first and second upper source/drain regions on the first and second lower source/drain regions and spaced apart from each other in the first horizontal direction; an upper active region between the first and second upper source/drain regions and contacting the first and second upper source/drain regions; a sacrificial gate structure on the lower and upper active regions, between the first and second lower source/drain regions, and between the first and second upper source/drain regions; and an insulating layer on the substrate. The first and second lower source/drain regions and the first and second upper source/drain regions may be in the insulating layer. The methods may also include replacing the sacrificial gate structure with a lower gate structure and an upper gate structure. The lower gate structure may be on the lower active region and between the first and second lower source/drain regions, and the upper gate structure may be on the upper active region and between the first and second upper source/drain regions. The lower gate structure has a first width in the first horizontal direction, and the upper gate structure has a second width in the first horizontal direction. The lower gate structure has a third width in a second horizontal direction that may be perpendicular to the first horizontal direction and is parallel to the upper surface of the substrate, and the upper gate structure has a fourth width in the second horizontal direction. The first width may be different from the second width, or the third width may be different from the fourth width.

BRIEF DESCRIPTION OF THE DRAWINGS

FIGS. 3A, 4A, 5A, 6A, and 7A are cross-sectional views taken along the line A-A' in FIG. 2A, and FIGS. 3B, 4B, 5B, 6B, and 7B are cross-sectional views taken along the line B-B' in FIG. 2A illustrating a method of forming a stacked integrated circuit device according to some embodiments of the present inventive concept.

FIG. 8B illustrates the region B in FIG. 7B.

FIGS. 9A and 10A are cross-sectional views taken along the line A-A' in FIG. 2A and FIGS. 9B and 10B are cross-sectional views taken along the line B-B' in FIG. 2A illustrating a method of forming a stacked integrated circuit device according to some embodiments of the present inventive concept.

FIGS. 11A and 12A are cross-sectional views taken along the line A-A' in FIG. 2A and FIGS. 11B and 12B are cross-sectional views taken along the line B-B' in FIG. 2A illustrating a method of forming a stacked integrated circuit device according to some embodiments of the present inventive concept.

FIGS. 17A and 17B are cross-sectional views taken along the line A-A' and the line B-B' in FIG. 2A, respectively, illustrating a stacked integrated circuit device according to some embodiments of the present inventive concept.

DETAILED DESCRIPTION

According to some embodiments of the present inventive concept, methods of forming an integrated circuit device including stacked transistors are provided. The methods may include forming lower and upper gate structures through separate processes. In some embodiments, the lower and upper gate structures may be formed by a replacement metal gate process. According to the methods, dimensions (e.g., a width and/or height) of the lower and upper gate structures can be changed independently by changing thicknesses and/or heights of spacer layers, and the dimensions of the lower and upper gate structures can be further adjusted independently to achieve predetermined performance (e.g., desirable performance). Further, according to the methods, the lower and upper gate structures can be formed to include different gate electrode materials. An integrated circuit device including stacked transistors is also referred to as a stacked integrated circuit device herein.

According to some embodiments of the present inventive concept, a stacked integrated circuit device may include lower and upper gate structures that have different dimensions (e.g., a width and/or height) and may have different gate electrode materials.

According to some embodiments of the present inventive concept, a stacked integrated circuit device may be an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D flip-flop.

An inverter will be described as an example of a stacked integrated circuit device with reference to FIGS. 1, 2A and 2B. The present inventive concept, however, can be applied to various stacked integrated circuit devices.

Figure 1:
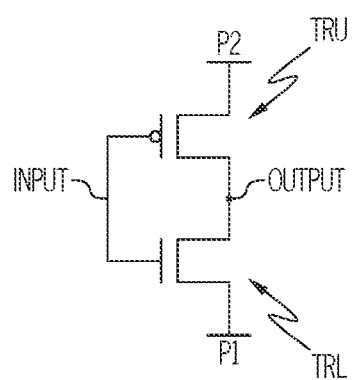
FIG. 1 is a circuit diagram of an inverter according to some embodiments of the present inventive concept.
Figure 2A:
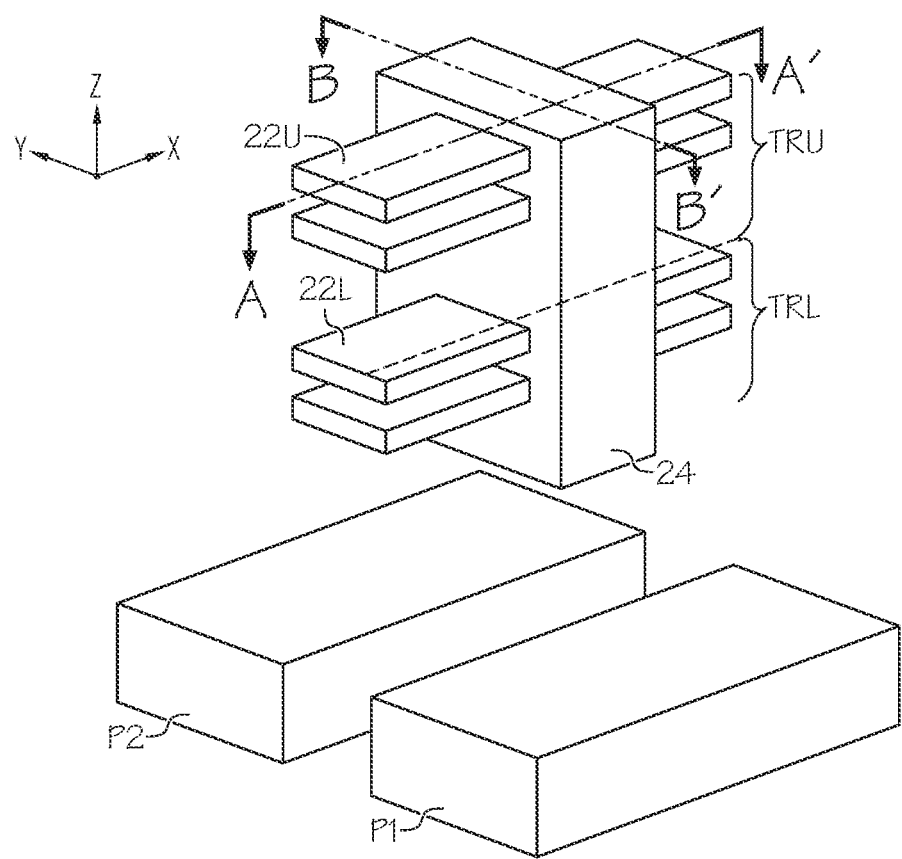
FIGS. 2A and 2B are perspective views of the inverter of FIG. 1 according to some embodiments of the present inventive concept.
Figure 2B:
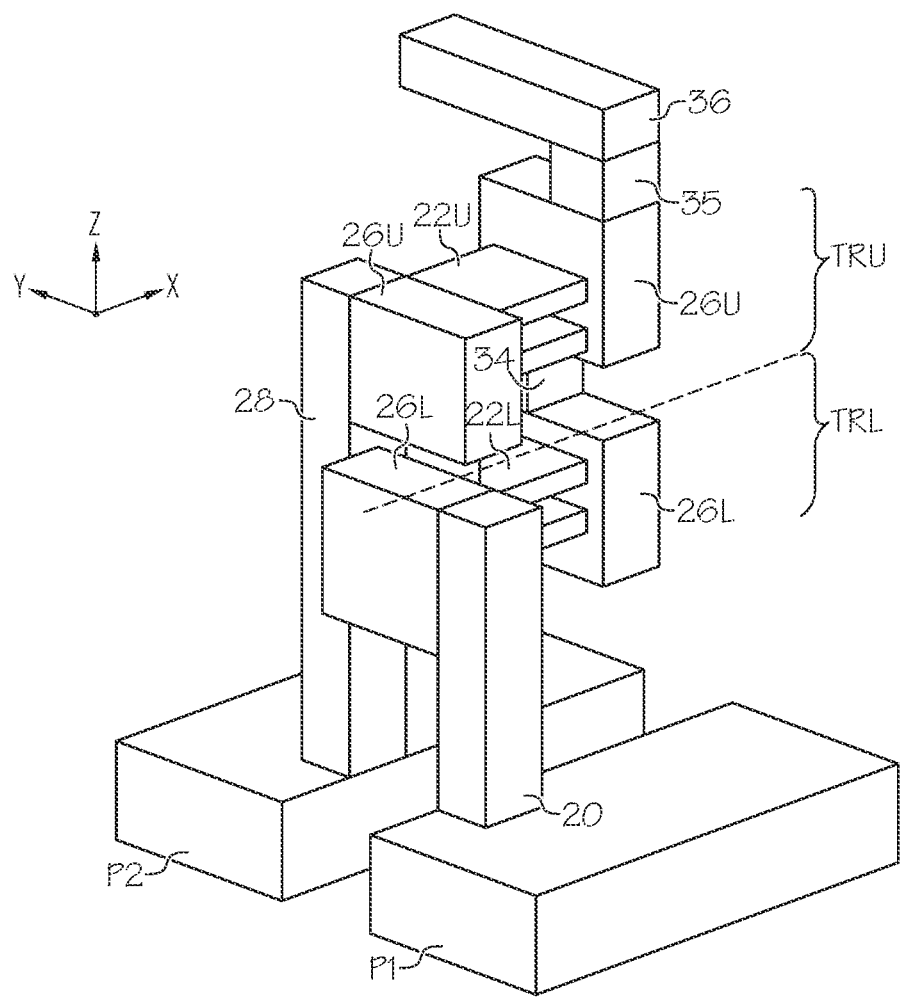

FIG. 1 is a circuit diagram of an inverter according to some embodiments of the present inventive concept, and FIGS. 2A and 2B are perspective views of the inverter of FIG. 1 according to some embodiments of the present inventive concept. Groups of elements of the single inverter are shown respectively in FIGS. 2A and 2B for simplicity of illustration, and thus each of FIGS. 2A and 2B shows some elements (but not all elements) of the single inverter. FIGS. 2A and 2B are provided to illustrate spatial relationships and electrical connections between elements, and the present inventive concept is not limited to the shapes and dimensions of those elements illustrated in FIGS. 2A and 2B.

Referring to FIGS. 1, 2A, and 2B, an inverter may include a lower transistor TRL (e.g., an N-type transistor) and an upper transistor TRU (e.g., a P-type transistor). The lower transistor TRL and the upper transistor TRU may be configured to receive a common input Input and may be configured to output a common output Output. Although not illustrated in FIGS. 2A and 2B, various insulating layers (e.g., a first insulating layer 42, a second insulating layer 44, and a third insulating layer 46 in FIGS. 3A and 3B) may be provided between conductive elements for electrical isolation.

The lower transistor TRL may be connected to a first power line P1, and the upper transistor TRU may be connected to a second power line P2. The first power line P1 may be connected to a first power having a first voltage (e.g., a source voltage). For example, the first voltage may be an electrical ground voltage. The second power line P2 may be connected to a second power having a second voltage (e.g., a drain voltage). As used herein "an element A connected to an element B" (or similar language) means that the element A is physically and/or electrically connected to the element B.

In some embodiments, each of the first power line P1 and the second power line P2 may extend in a first horizontal direction (e.g., a X direction) and may be spaced apart from each other in a second horizontal direction (e.g., a Y direction). Both the first horizontal direction and the second horizontal direction may be parallel to an upper surface of a substrate (e.g., an upper surface 100U of a substrate 100 in FIGS. 3A and 3B). The first horizontal direction may traverse the second horizontal direction. In some embodiments, the first horizontal direction may be perpendicular to the second horizontal direction. As used herein, "an element A extends in a direction B" (or similar language) means that the element A extends longitudinally in the direction B.

The lower transistor TRL may include lower active regions 22L and lower source/drain regions 26L contacting opposing ends of the lower active regions 22L, respectively. In some embodiments, the lower active regions 22L may extend in the first horizontal direction, and the lower source/drain regions 26L may be spaced apart from each other in the first horizontal direction. One of the lower source/drain regions 26L may be electrically connected to the first power line P1 through a first power via 20. "Active region" as used herein refers to a region in which a channel of a transistor is formed when the transistor is turned on. Accordingly, "active region" may be interchangeable with "channel region."

The upper transistor TRU may include upper active regions 22U and upper source/drain regions 26U contacting opposing ends of the upper active regions 22U, respectively. In some embodiments, the upper active regions 22U may extend in the first direction X, and the upper source/drain regions 26U may be spaced apart from each other in the first horizontal direction. One of the upper source/drain regions 26U may be electrically connected to the second power line P2 through a second power via 28.

In some embodiments, the lower active regions 22L and the upper active regions 22U may include multiple layers stacked in a vertical direction (e.g., a Z direction) that may be perpendicular to both the first horizontal direction and the second horizontal direction. Although FIG. 2A illustrates that the lower active regions 22L include two stacked layers, and the upper active regions 22U include two stacked layers, the lower active regions 22L and the upper active regions 22U may include various number of layers.

The inverter may also include a gate structure 24 on the lower active regions 22L and the upper active regions 22U. In some embodiments, the gate structure 24 may contact both the lower active regions 22L and the upper active regions 22U and may be shared by the lower transistor TRL and the upper transistor TRU. The gate structure 24 may include a lower portion that is between the lower source/drain regions 26L, and the lower portion of the gate structure 24 may be a lower gate structure (e.g., a lower gate structure 24L in FIGS. 7A and 7B). The gate structure 24 may include an upper portion that is between the upper source/drain regions 26U, and the upper portion of the gate structure 24 may be an upper gate structure (e.g., an upper gate structure 24U in FIGS. 7A and 7B).

Although FIG. 2A illustrates the gate structure 24 as a single layer, the gate structure 24 may include multiple layers that include, for example, a gate insulator (e.g., gate insulators 24L_1 or 24U_1 in FIGS. 8A and 8B) and a gate electrode (e.g., gate electrodes 24L_3 and 24U_3 in FIGS. 8A and 8B) sequentially stacked on the lower active regions 22L or the upper active regions 22U.

One of the lower source/drain regions 26L and one of the upper source/drain regions 26U may be electrically connected to each other through a conductive contact 34. In some embodiments, the conductive contact 34 may contact both the lower source/drain region 26L and the upper source/drain region 26U as illustrated in FIG. 2B. The conductive contact 34 may electrically connect the lower source/drain region 26L and the upper source/drain region 26U to a metal line 36 that may be formed during BEOL processes.

FIGS. 3A, 4A, 5A, 6A, and 7A are cross-sectional views taken along the line A-A' in FIG. 2A, and FIGS. 3B, 4B, 5B, 6B, and 7B are cross-sectional views taken along the line B-B' in FIG. 2A illustrating a method of forming a stacked integrated circuit device according to some embodiments of the present inventive concept.

Figure 3B:
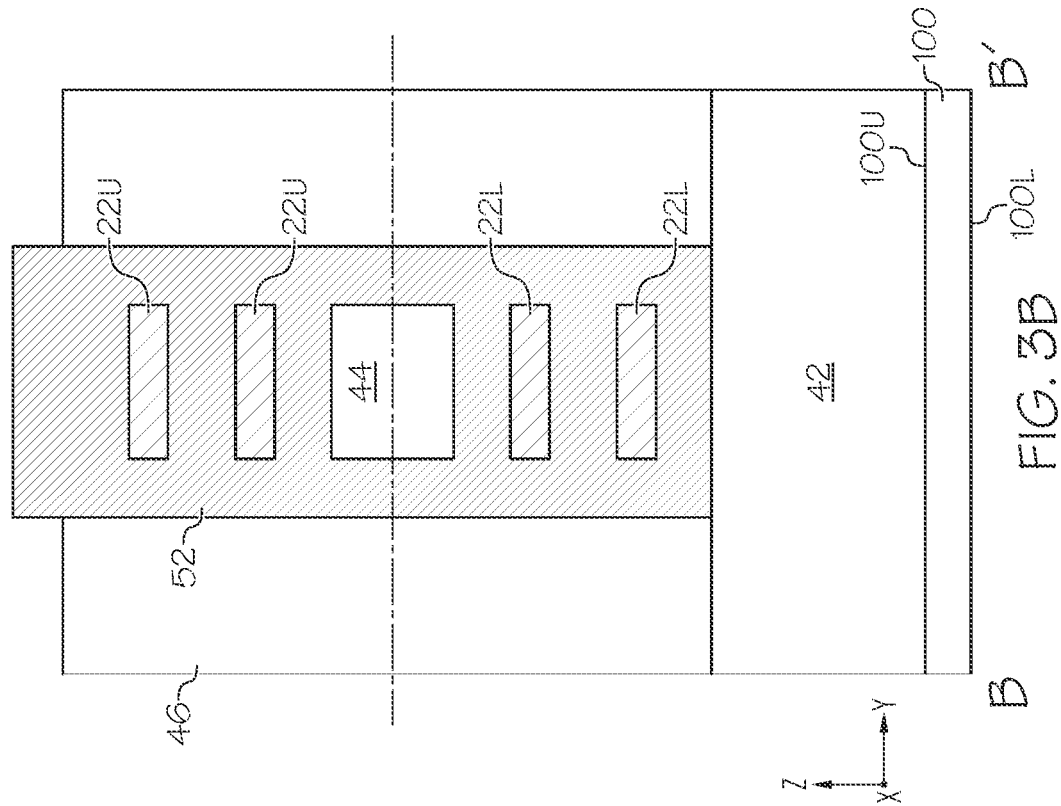
Figure 3A:
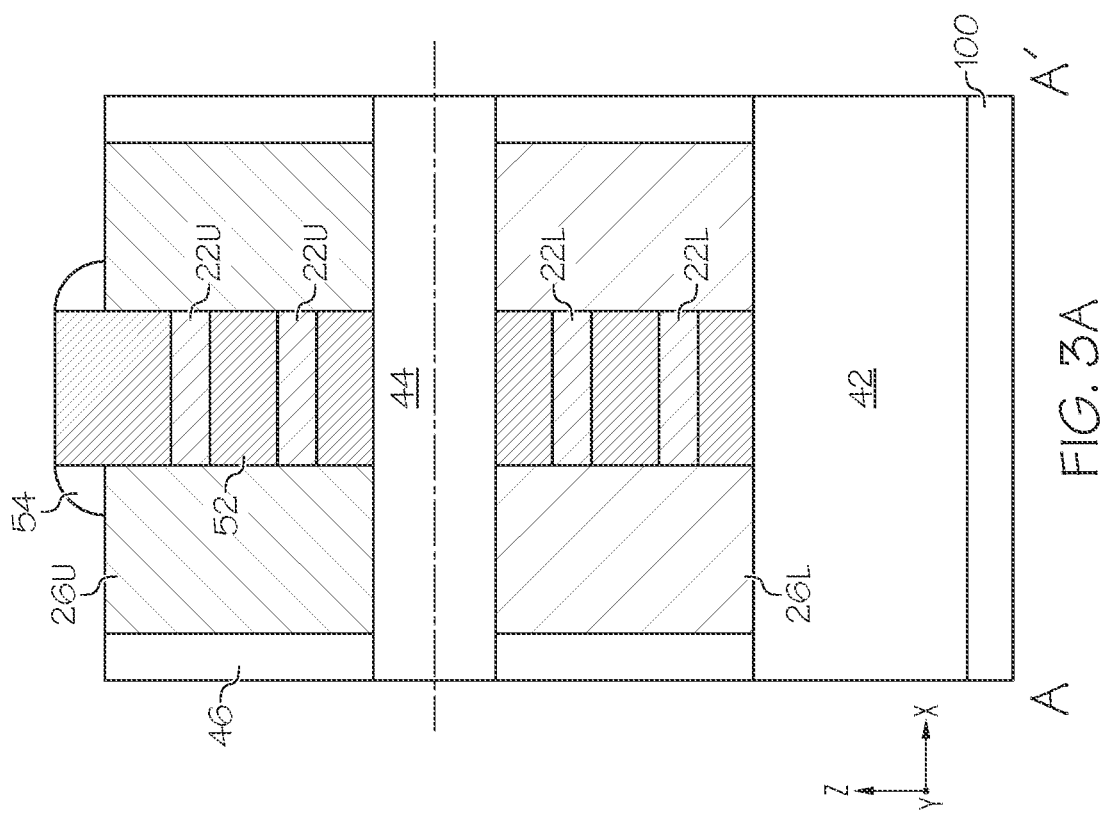

Referring to FIGS. 3A and 3B, the method may include forming a preliminary stacked structure on a substrate 100. The preliminary stacked structure may include lower source/drain regions 26L, lower active regions 22L, upper source/drain regions 26U, and upper active regions 22U. The preliminary stacked structure may also include a first insulating layer 42 that may be formed between the substrate 100 and the lower source/drain regions 26L, a second insulating layer 44 that may be formed between the lower source/drain regions 26L and the upper source/drain regions 26U, and a third insulating layer 46 that may be formed on the substrate 100. The lower source/drain regions 26L, the lower active regions 22L, the upper source/drain regions 26U, and the upper active regions 22U may be provided in the third insulating layer 46. For simplicity of illustration, the substrate 100 will be omitted from other cross-sectional views.

The lower source/drain regions 26L may be spaced apart from each other in a first horizontal direction (e.g., a X direction), and the upper source/drain regions 26U may be spaced apart from each other in the first horizontal direction. The first horizontal direction may be parallel to an upper surface 100U of the substrate 100. The substrate 100 may also include a lower surface 100L opposite the upper surface 100U. The upper surface 100U and the lower surface 100L may be parallel to each other. The lower source/drain regions 26L may contact opposing side surfaces of the lower active regions 22L, respectively, and the upper source/drain regions 26U may contact opposing side surfaces of the lower active regions 22U, respectively.

The lower source/drain regions 26L and the upper source/drain regions 26U may include semiconductor material(s) (e.g., silicon, germanium, silicon-germanium) and may also optionally include dopants. For example, the lower source/drain regions 26L and the upper source/drain regions 26U may be formed by an epitaxial growth process using the lower active regions 22L and upper active regions 22U as a seed layer.

The preliminary stacked structure may further include a sacrificial gate structure 52 on the lower active regions 22L and the upper active regions 22U. The sacrificial gate structure 52 may enclose the lower active regions 22L and the upper active regions 22U and may continuously extend from the lower active regions 22L onto the upper active regions 22U as illustrated in FIGS. 3A and 3B. The sacrificial gate structure 52 may be between the lower source/drain regions 26L and between the upper source/drain regions 26U.

The sacrificial gate structure 52 may include a semiconductor material (e.g., silicon, germanium, silicon-germanium) and/or an insulating material, which can be selectively removed with respect to surrounding elements (e.g., the lower active regions 22L and the upper active regions 22U). Although FIGS. 3A and 3B illustrate the sacrificial gate structure 52 as a single layer, the sacrificial gate structure 52 may include multiple layers. In some embodiments, the sacrificial gate structure 52 may include spacer layers contacting side surfaces of lower source/drain regions 26L and the upper source/drain regions 26U. Additionally, the preliminary stacked structure may include gate spacers 54 on the upper source/drain regions 26U. The gate spacers 54 may include an insulating material (e.g., silicon oxide, silicon nitride, and/or silicon oxynitride).

The lower active regions 22L may include multiple layers stacked in a vertical direction (e.g., a Z direction). The vertical direction may be perpendicular to the upper surface 100U of the substrate 100. The lower active region 22L may extend longitudinally in the first horizontal direction. The upper active regions 22U may include multiple layers stacked in the vertical direction and may extend longitudinally in the first horizontal direction. In some embodiments, each of the layers of the lower active regions 22L and the upper active regions 22U may be a nanosheet. The nanosheets of the lower active regions 22L and the upper active regions 22U may include semiconductor material(s) (e.g., silicon, germanium, silicon-germanium, and/or a III-V semiconductor compound) For example, each of the nanosheets may have a thickness in a range of, for example, from 1 nm to 100 nm in the vertical direction.

The substrate 100 may include a semiconductor material (e.g., silicon, germanium, silicon-germanium) and/or a III-V semiconductor compounds (e.g., GaP, GaAs, GaSb). In some embodiments, the substrate 100 may be a semiconductor-on-insulator substrate (e.g., such as a silicon-on-insulator (SOI) substrate or a germanium-on-insulator (GOI) substrate). As used herein the term "and/or" includes any and all combinations of one or more of the associated listed items.

The first insulating layer 42, the second insulating layer 44, and the third insulating layer 46 may include various insulating material(s) (e.g., silicon oxide, silicon nitride, and/or an insulating material having a dielectric constant lower than a dielectric constant of silicon dioxide).

Figure 4A:
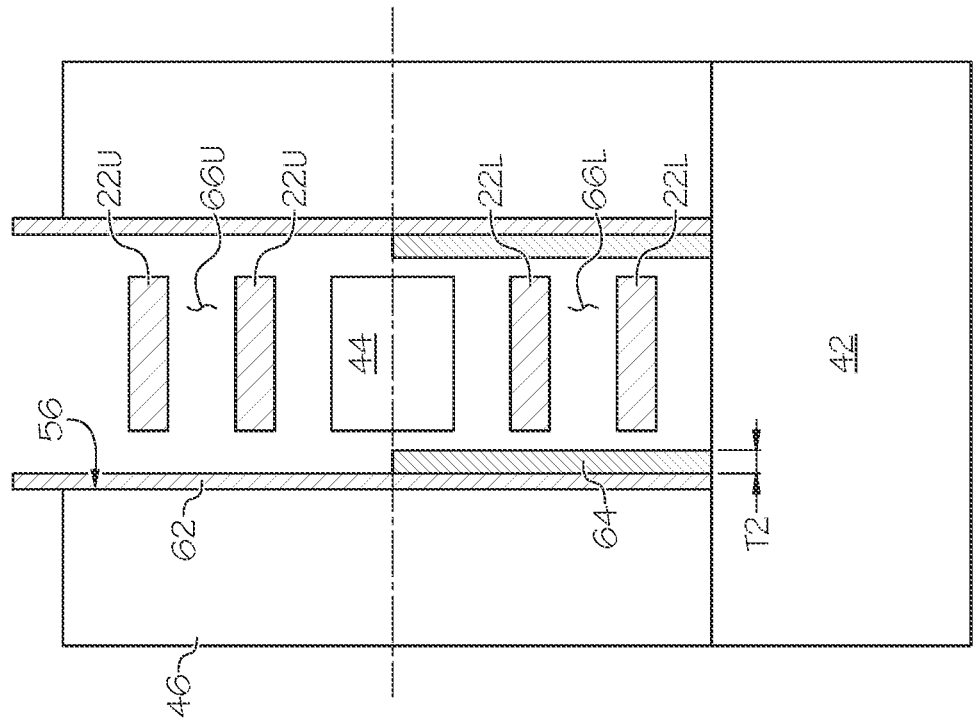
Figure 4B:
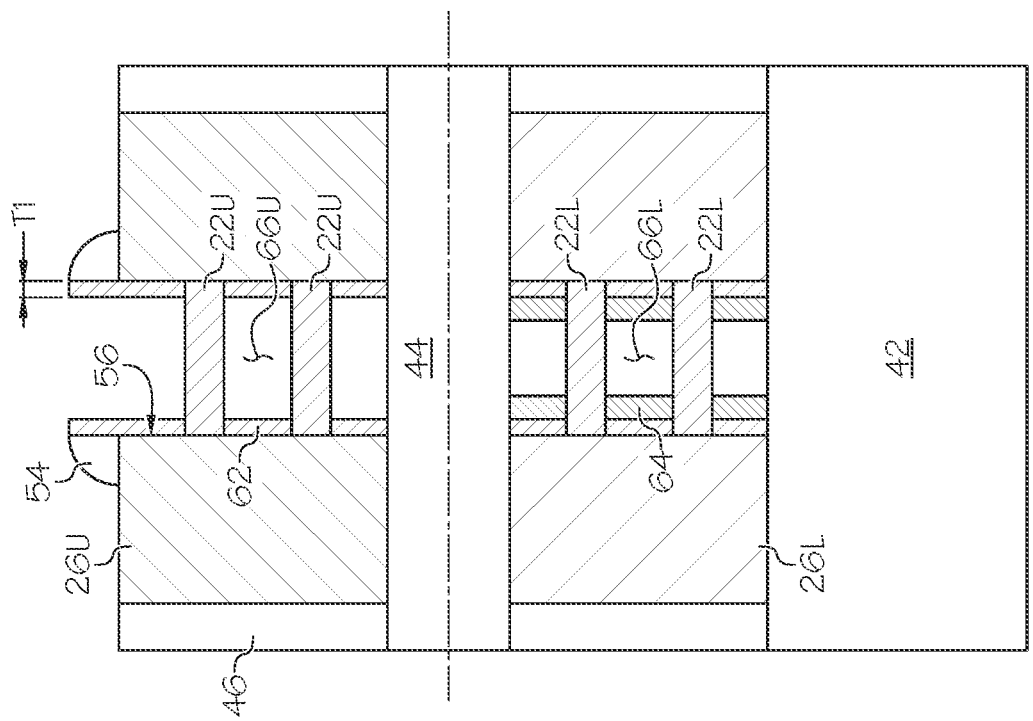

Referring to FIGS. 4A and 4B, the method may include removing the sacrificial gate structure 52 to form an opening 56 in the third insulating layer 46. The opening 56 may be between the lower source/drain regions 26L and between the upper source/drain regions 26U. In some embodiments, the opening 56 may expose surfaces of the lower active regions 22L and the upper active regions 22U. The sacrificial gate structure 52 may be removed by various process(es) (e.g., a dry etch process and/or a wet etch process).

After the opening 56 is formed by removing the sacrificial gate structure 52, a first spacer layer 62 may be formed on sides of the opening 56. For example, a preliminary first spacer layer may be formed in the opening 56 and on an upper surface of the upper source/drain regions 26U after the sacrificial gate structure 52 is removed, and then an etch process may be performed to remove a portion of the preliminary first spacer layer formed on the upper surface of the upper source/drain regions 26U. The first spacer layer 62 may continuously extend from the first insulating layer 42 to an uppermost portion of the upper source/drain region 26U as illustrated in FIGS. 4A and 4B. The first spacer layer 62 may have a first thickness T1 in the first horizontal direction, and the first thickness T1 may be uniform along the vertical direction. For example, the first thickness T1 may be less than 10 nm (e.g., from about 1 nm to about 5 nm).

A second spacer layer 64 may be formed on a lower portion of the first spacer layer 62 and may define a lower opening 66L. The second spacer layer 64 may expose an upper portion of the first spacer layer 62, and the upper portion of the first spacer layer 62 may define an upper opening 66U. The second spacer layer 64 may have a second thickness T2 in the first horizontal direction, and the second thickness T2 may be uniform along the vertical direction. For example, a preliminary second spacer layer may be formed in the opening 56 and on the upper surface of the upper source/drain regions 26U after the first spacer layer 62 is formed, and then an etch process may be performed to remove a portion of the preliminary second spacer layer formed on the upper surface of the upper source/drain regions 26U and formed on the upper portion of the first spacer layer 62. For example, the second thickness T2 may be less than 10 nm (e.g., from about 1 nm to about 5 nm).

The first spacer layer 62 and the second spacer layer 64 may include various materials (e.g., silicon oxide, silicon nitride, silicon oxynitride, silicon, germanium, silicon-germanium). The first spacer layer 62 may include a material different from the second spacer layer 64 such that the second spacer layer 64 may be removed selectively with respect to the first spacer layer 62. The first spacer layer 62 may not be substantially removed while removing the second spacer layer 64. For example, less than 5% of the first thickness T1 of the first spacer layer 62 may be removed while removing the second spacer layer 64.

The first thickness T1, the second thickness T2, and a height of the second spacer layer 64 in the vertical direction determine dimensions of the lower transistor TRL and the upper transistor TRU Accordingly, desirable performance of the lower transistor TRL and the upper transistor TRU may be achieved by changing the first thickness T1, the second thickness T2, and height of the second spacer layer 64 in the vertical direction.

Figure 5A:
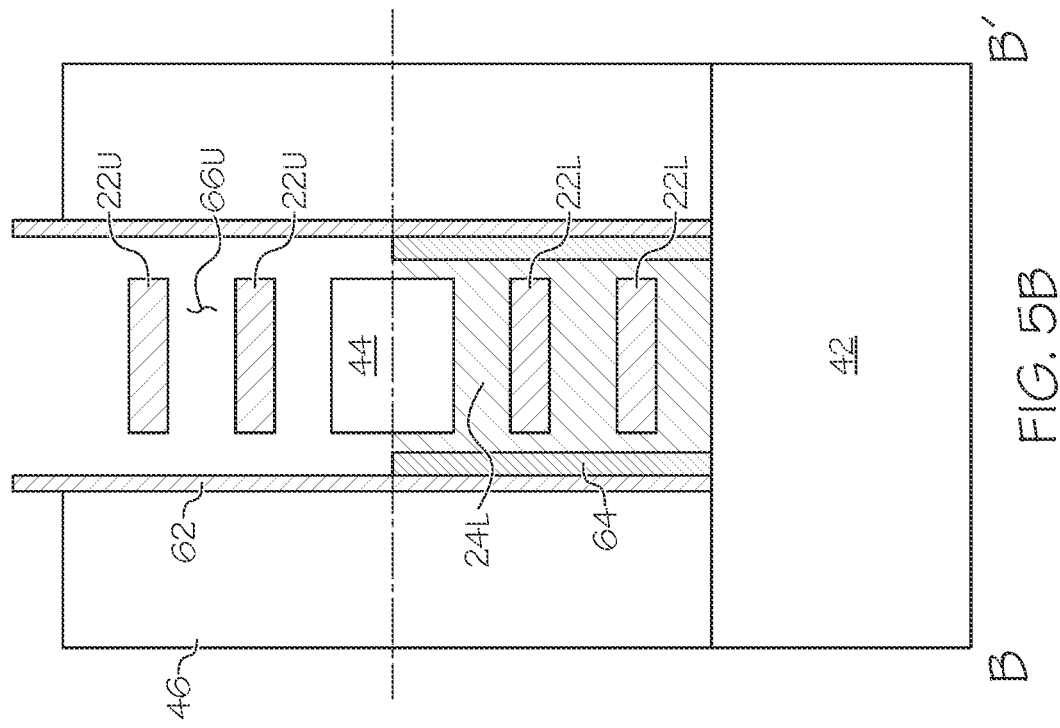
Figure 5B:
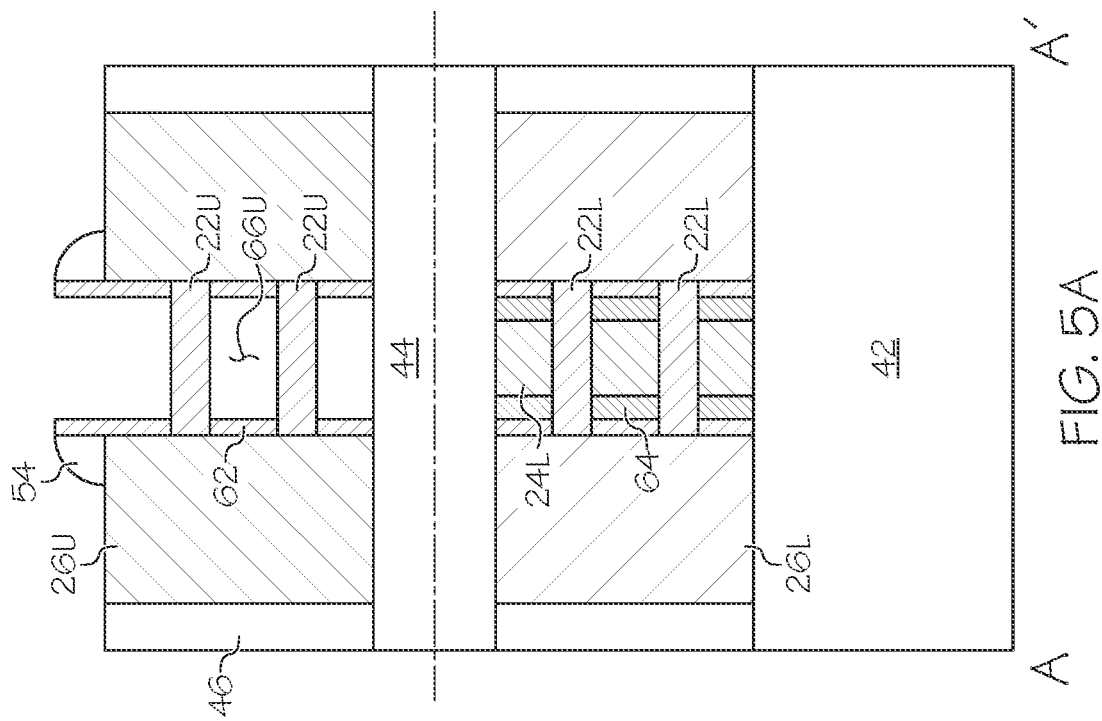

Referring to FIGS. 5A and 5B, a lower gate structure 24L may be formed in the lower opening 66L. For example, a preliminary lower gate structure may be formed in the lower opening 66L and the upper opening 66U, and then an upper portion of the preliminary lower gate structure may be removed by an etch process. When the upper portion of the preliminary lower gate structure is removed, the second spacer layer 64 may function as an etch stop layer, and thus the lower gate structure 24L may be formed to have a height that is equal to the height of the second spacer layer 64 in the vertical direction.

Figure 8A:
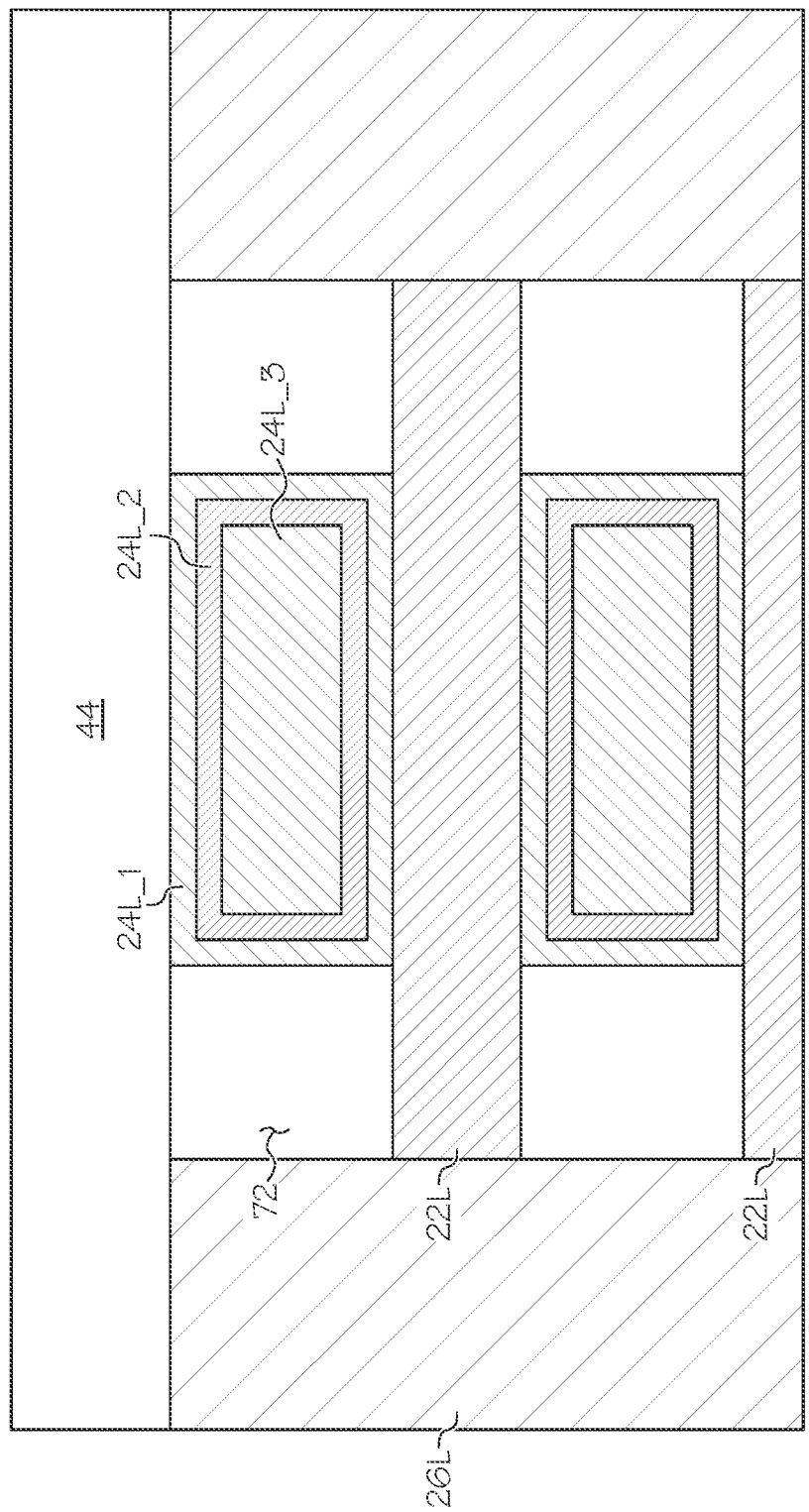
FIG. 8A illustrates the region A in FIG. 7A.

Referring to FIGS. 6A and 6B, an upper gate structure 24U may be formed on the lower gate structure 24L in the upper opening 66U. Although FIGS. 5A and 5B illustrate each of the lower gate structure 24L and the upper gate structure 24U as a single layer, each of the lower gate structure 24L and the upper gate structure 24U may include multiple layers sequentially formed as illustrated in FIGS. 8A and 8B. In some embodiments, the first spacer layer 62 and the second spacer layer 64 may not be removed, and middle of line (MOL) processes may be performed after the structure illustrated in FIGS. 6A and 6B is formed.

Referring to FIGS. 7A and 7B, in some embodiments, the first spacer layer 62 and the second spacer layer 64 may be removed thereby forming a space 72 between the lower gate structure 24L and the lower source/drain regions 26L and between the upper gate structure 24U and the upper source/drain regions 26U. The space 72 may be filled with an insulating material through subsequent processes.

The lower gate structure 24L may have a first width W1 in the first horizontal direction, which is narrower than a second width W2 of the upper gate structure 24U in the first horizontal direction. A difference between the first width W1 and the second width W2 may be about two times the second thickness T2 of the second spacer layer 64. The lower gate structure 24L may have a third width W3 in the second horizontal direction, which is narrower than a fourth width W4 of the upper gate structure 24U in the second horizontal direction. A difference between the third width W3 and the fourth width W4 may be about two times the second thickness T2 of the second spacer layer 64.

FIG. 8A illustrates the region A in FIG. 7A, and FIG. 8B illustrates the region B in FIG. 7B. Referring to FIGS. 8A and 8B, the lower gate structure 24L may include a lower gate insulator 24L_1, a lower work function layer 24L_2, and a lower metal layer 24L_3, and the upper gate structure 24U may include an upper gate insulator 24U_1, an upper work function layer 24U_2, and an upper metal layer 24U_3. The lower and upper gate insulators 24L_1 and 24U_1 may include, for example, an oxide layer (e.g., silicon oxide layer) and/or an insulating layer having a dielectric constant higher than a dielectric constant of silicon dioxide (e.g., hafnium oxide, tantalum oxide, zirconium oxide). The lower and upper work function layers 24L_2 and 24U_2 may include, for example, titanium nitride, titanium oxynitride, tantalum nitride, tantalum oxynitride, tungsten nitride, tungsten carbonitride, aluminum oxide. The lower and upper metal layers 24L_3 and 24U_3 may include, for example, metal (e.g., titanium, aluminum), metal alloy, and/or nitride or carbide of the metal Sizes and materials of the lower and upper gate insulators 24L_1 and 24U_1, the lower and upper work function layers 24L_2 and 24U_2, and the lower and upper metal layers 24L_3 and 24U_3 may be determined considering conductive types and/or characteristics (e.g., threshold voltage) of the lower gate structure 24L and the upper gate structure 24U. The lower work function layer 24L_2 and the lower metal layer 24L_3 may be collectively referred to as a lower gate electrode, and the upper work function layer 24U_2 and the upper metal layer 24U_3 may be collectively referred to as an upper gate electrode.

As discussed with reference to FIG. 2A, the lower gate structure 24L and the upper gate structure 24U may be connected to each other, and the lower gate electrode and the upper gate electrode may be electrically connected to each other.

Figure 10B:
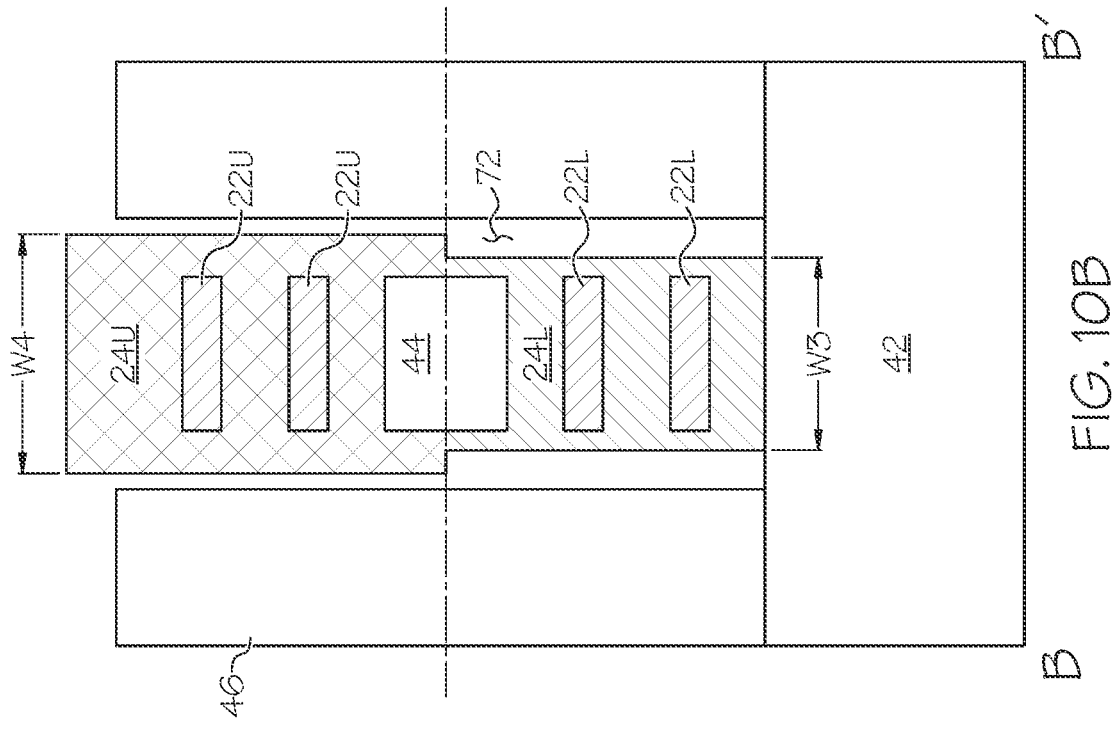
Figure 10A:
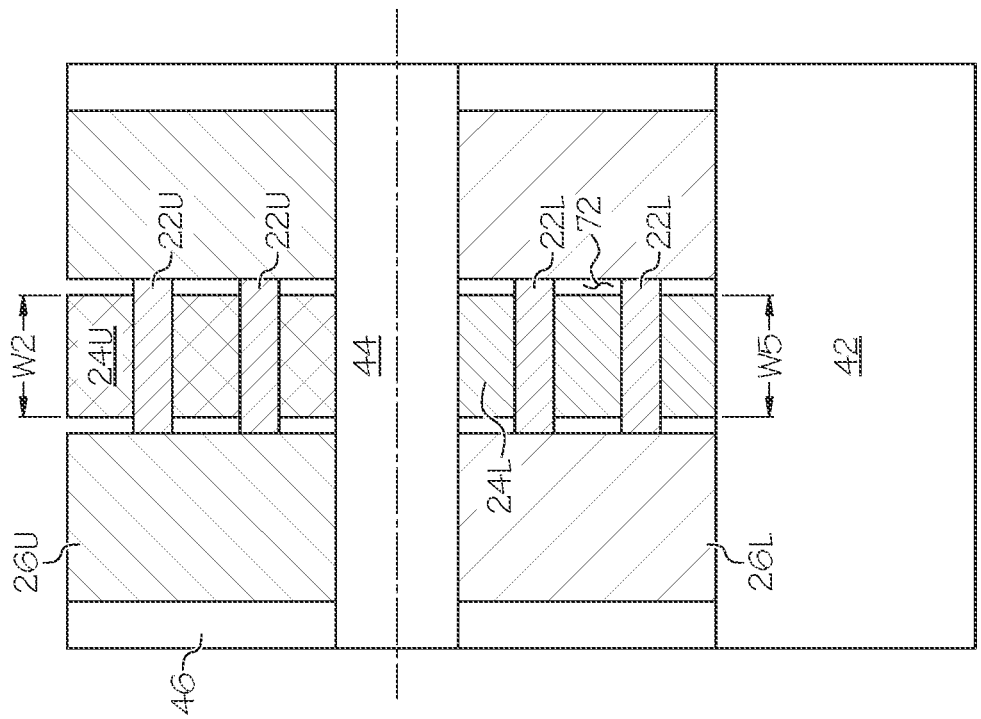

FIGS. 9A and 10A are cross-sectional views taken along the line A-A' in FIG. 2A and FIGS. 9B and 10B are cross-sectional views taken along the line B-B' in FIG. 2A illustrating a method of forming a stacked integrated circuit device according to some embodiments of the present inventive concept.

Referring to FIGS. 9A and 9B, the method may include the same or similar processes discussed with reference to FIGS. 3A, 3B, 4A and 4B, and then portions of the second spacer layer 64 formed on first sides of the opening 56, which are spaced apart from each other in the first horizontal direction, may be removed. Accordingly, sides of a lower opening 66L', which are spaced apart from each other in the first horizontal direction, may be defined by the first spacer layer 62 as illustrated in FIG. 9A.

Referring to FIGS. 10A and 10B, after the lower opening 66L' is formed, the same or similar processes discussed with reference to FIGS. 5A, 5B, 6A and 6B may be performed. The lower gate structure 24L may have a fifth width W5 in the first horizontal direction, which may be equal to the second width W2 of the upper gate structure 24U in the first horizontal direction. The lower gate structure 24L may have the third width W3 in the second horizontal direction, which is narrower than the fourth width W4 of the upper gate structure 24U in the second horizontal direction. A difference between the third width W3 and the fourth width W4 may be about two times the second thickness T2 of the second spacer layer 64.

Figure 11B:
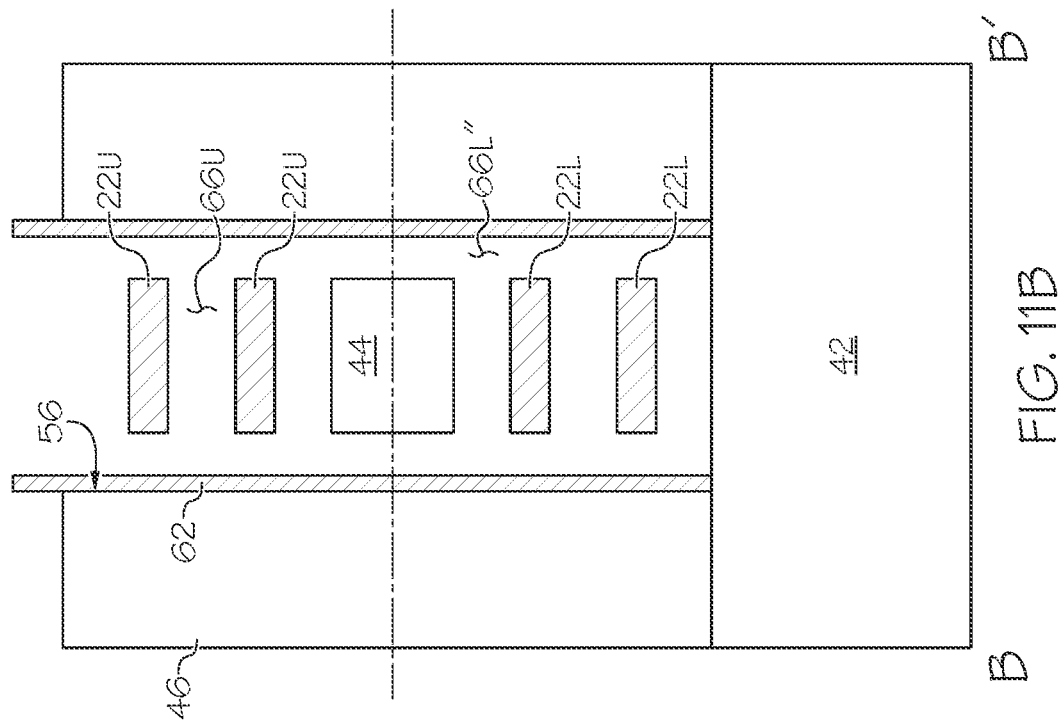
Figure 11A:
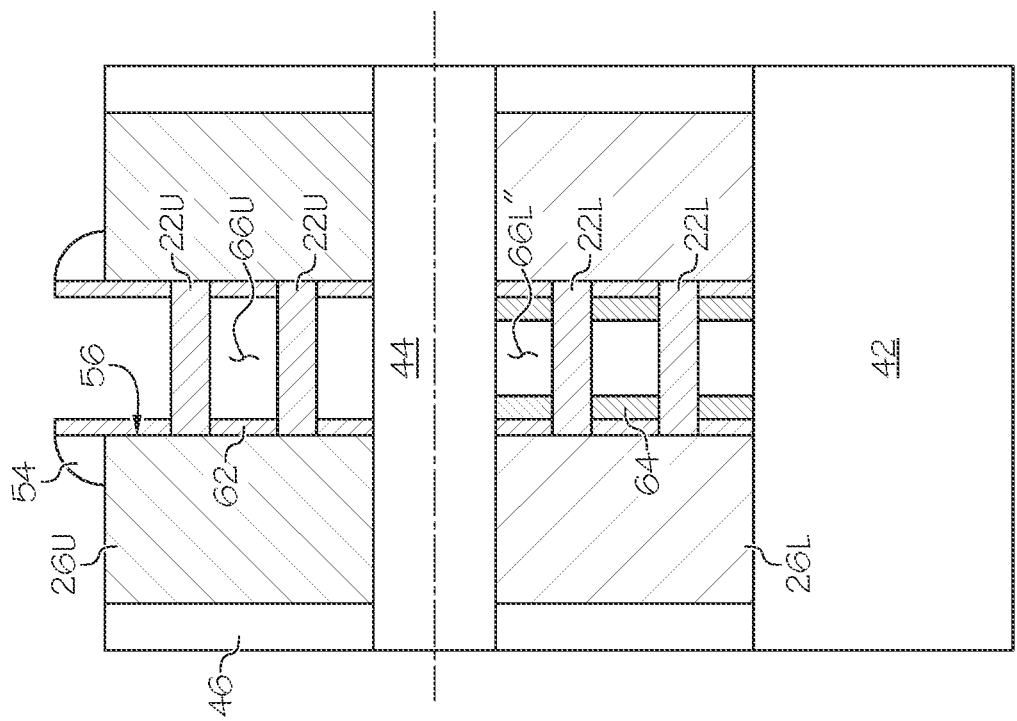

FIGS. 11A and 12A are cross-sectional views taken along the line A-A' in FIG. 2A and FIGS. 11B and 12B are cross-sectional views taken along the line B-B' in FIG. 2A illustrating a method of forming a stacked integrated circuit device according to some embodiments of the present inventive concept.

Referring to FIGS. 11A and 11B, the method may include the same or similar processes discussed with reference to FIGS. 3A, 3B, 4A and 4B, and then portions of the second spacer layer 64 formed on second sides of the opening 56, which are spaced apart from each other in the second horizontal direction, may be removed. Accordingly, sides of a lower opening 66L", which are spaced apart from each other in the second horizontal direction, may be defined by the first spacer layer 62 as illustrated in FIG. 11B.

Referring to FIGS. 12A and 12B, after the lower opening 66L" is formed, the same or similar processes discussed with reference to FIGS. 5A, 5B, 6A and 6B may be performed. The lower gate structure 24L may have the first width W1 in the first horizontal direction, which is narrower than a second width W2 of the upper gate structure 24U in the first horizontal direction. A difference between the first width W1 and the second width W2 may be about two times the second thickness T2 of the second spacer layer 64. The lower gate structure 24L may have a sixth width W6 in the second horizontal direction, which may be equal to the fourth width W4 of the upper gate structure 24U in the second horizontal direction.

FIGS. 13A, 14A, 15A and 16A are cross-sectional views taken along the line A-A' in FIG. 2A and FIGS. 13B, 14B, 15B and 16B are cross-sectional views taken along the line B-B' in FIG. 2A illustrating a method of forming a stacked integrated circuit device according to some embodiments of the present inventive concept.

Figure 13B:
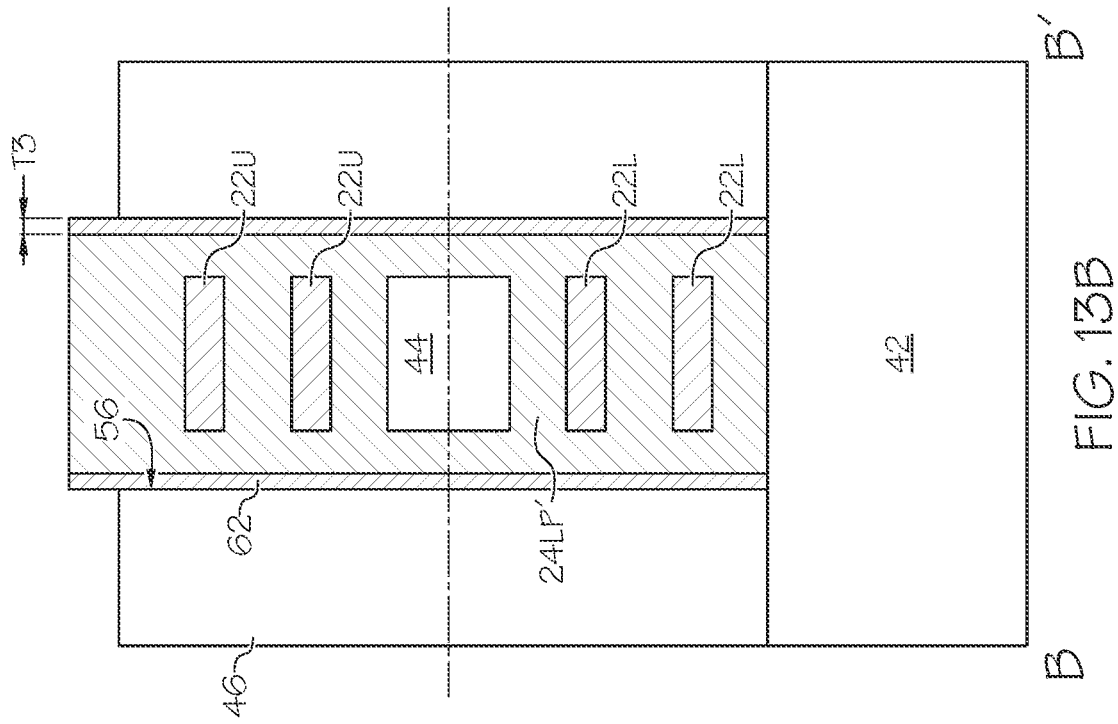
FIGS. 13A, 14A, 15A and 16A are cross-sectional views taken along the line A-A' in FIG. 2A and FIGS. 13B, 14B, 15B and 16B are cross-sectional views taken along the line B-B' in FIG. 2A illustrating a method of forming a stacked integrated circuit device according to some embodiments of the present inventive concept.
Figure 13A:
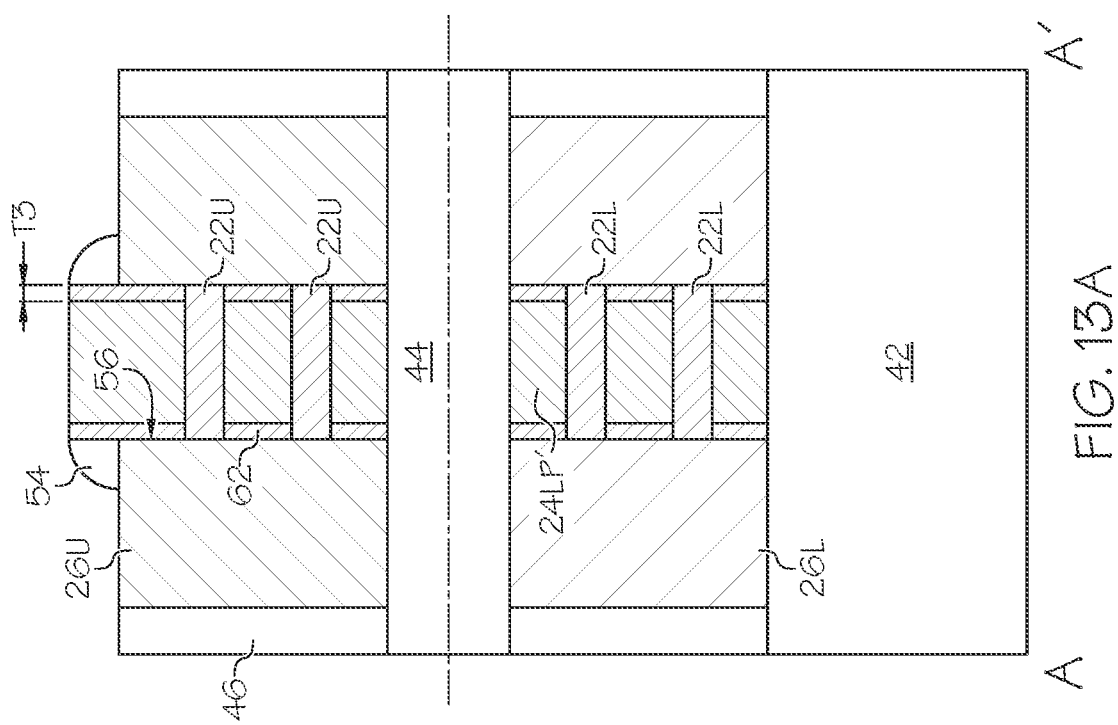

Referring to FIGS. 13A and 13B, after the preliminary stacked structure illustrated in FIGS. 3A and 3B is formed, the sacrificial gate structure 52 may be removed to form an opening 56, a first spacer layer 62 may be formed on sides of the opening 56, and then a preliminary lower gate structure 24LP' may be formed in the opening 56. The first spacer layer 62 may continuously extend from the first insulating layer 42 to an uppermost portion of the upper source/drain region 26U. The first spacer layer 62 may have a third thickness T3 in the first horizontal direction, and the third thickness T3 may be uniform along the vertical direction.

Figure 14B:
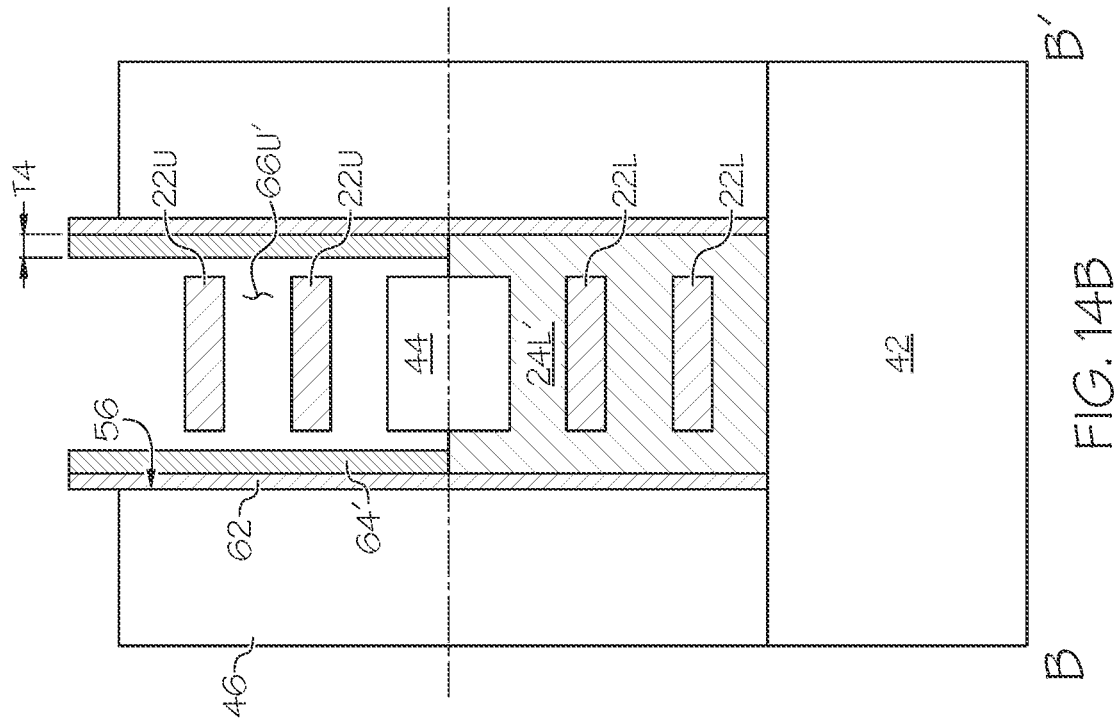
Figure 14A:
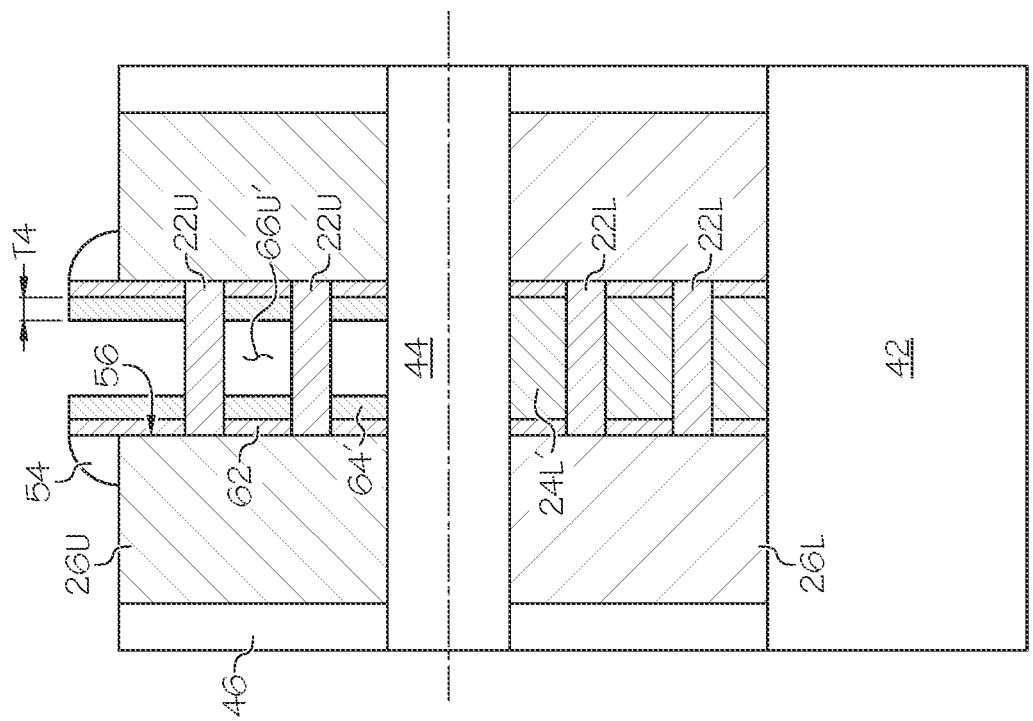

Referring to FIGS. 14A and 14B, an upper portion of the preliminary lower gate structure 24LP may be removed from an upper portion of the opening 56 using an etch process to form a lower gate structure 24L' in a lower portion of the opening 56. A second spacer layer 64' may be formed on the lower gate structure 24L' and on an upper portion of the first spacer layer 62. The second spacer layer 64' may define an upper opening 66U on the lower gate structure 24L'. The second spacer layer 64' may have a fourth thickness T4 in the first horizontal direction, and the fourth thickness T4 may be uniform along the vertical direction.

Figure 15B:
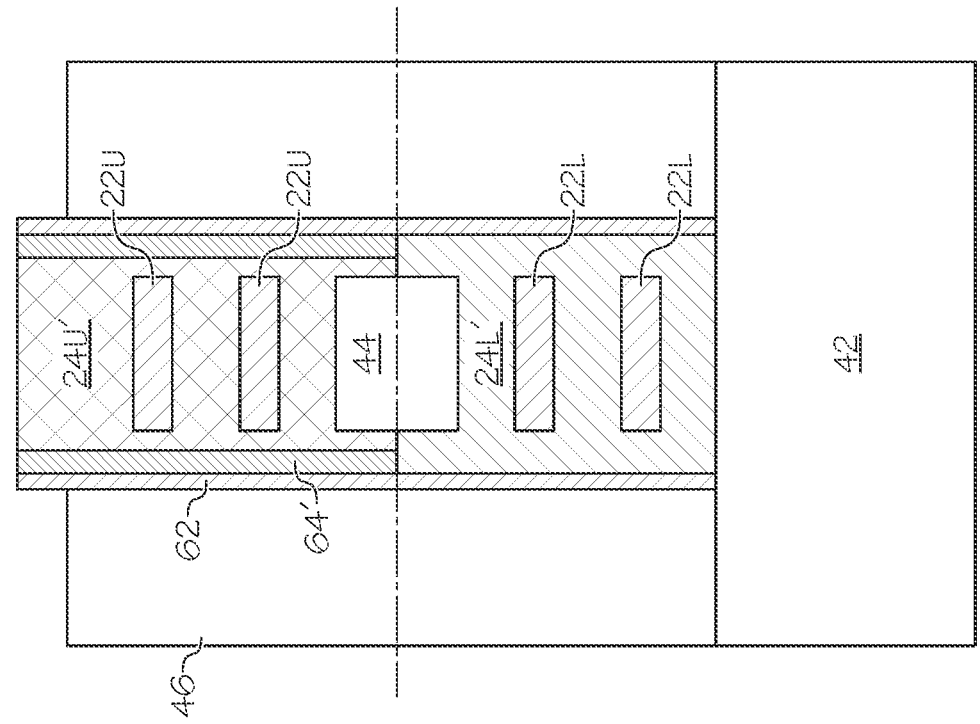
Figure 15A:
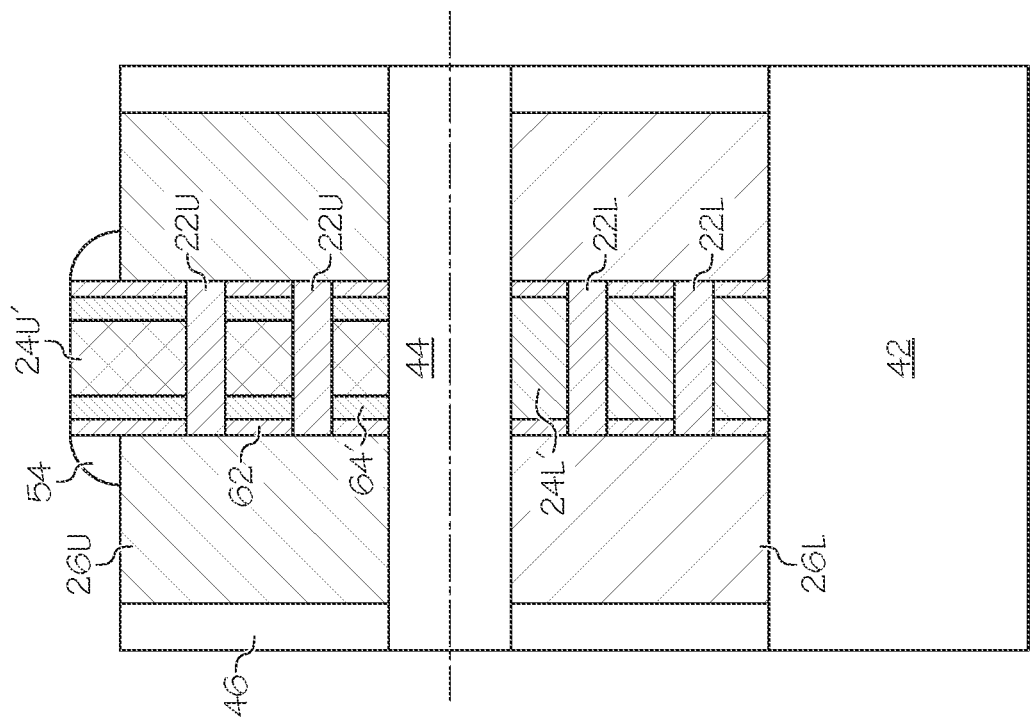

Referring to FIGS. 15A and 15B, an upper gate structure 24U may be formed in the upper opening 66U. In some embodiments, the first spacer layer 62 and the second spacer layer 64' may not be removed, and MOL processes may be performed after the structure illustrated in FIGS. 15A and 15B.

Figure 16B:
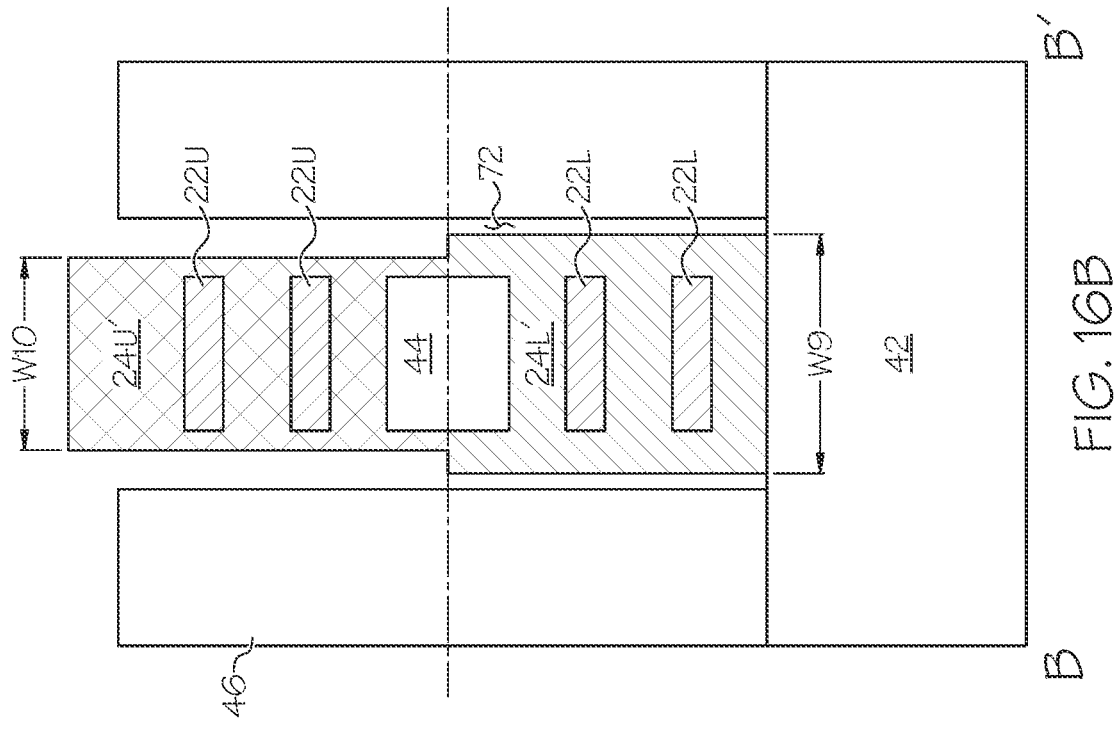
Figure 16A:
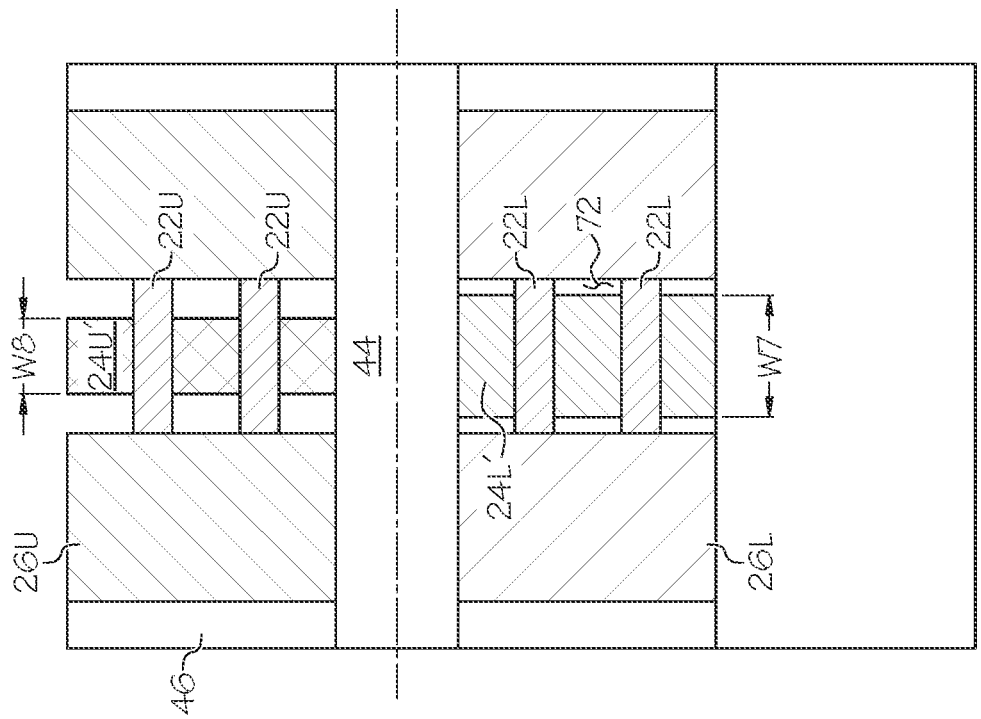

Referring to FIGS. 16A and 16B, in some embodiments, the first spacer layer 62 and the second spacer layer 64' may be removed thereby forming a space 72 between the lower gate structure 24L' and the lower source/drain regions 26L and between the upper gate structure 24U and the upper source/drain regions 26U. The space 72 may be filled with an insulating material through subsequent processes.

The lower gate structure 24L' may have a seventh width W7 in the first horizontal direction, which is wider than an eighth width W8 of the upper gate structure 24U in the first horizontal direction. A difference between the seventh width W7 and the eighth width W8 may be about two times the fourth thickness T4 of the second spacer layer 64'. The lower gate structure 24L' may have a ninth width W9 in the second horizontal direction, which is narrower than a tenth width W10 of the upper gate structure 24U in the second horizontal direction. A difference between ninth width W9 and the tenth width W10 may be about two times the fourth thickness T4 of the second spacer layer 64.

FIGS. 17A and 17B are cross-sectional views taken along the line A-A' and the line B-B' in FIG. 2A, respectively, illustrating a stacked integrated circuit device according to some embodiments of the present inventive concept.

The stacked integrated circuit device illustrated in FIGS. 17A and 17B may be formed by a method that includes the same or similar processes discussed with reference to FIGS. 13A, 13B, 14A and 14B, and then portions of the second spacer layer 64' formed on first sides of the opening 56, which are spaced apart from each other in the first horizontal direction, may be removed before forming an upper gate structure 24U.

Referring to FIGS. 17A and 17B, the upper gate structure 24U may have an eleventh width W11 in the first horizontal direction, which may be equal to the seventh width W7 of the lower gate structure 24L' in the first horizontal direction. The lower gate structure 24L' may have the ninth width W9 in the second horizontal direction, which is narrower than the tenth width W10 of the upper gate structure 24U in the second horizontal direction.

Figure 18B:
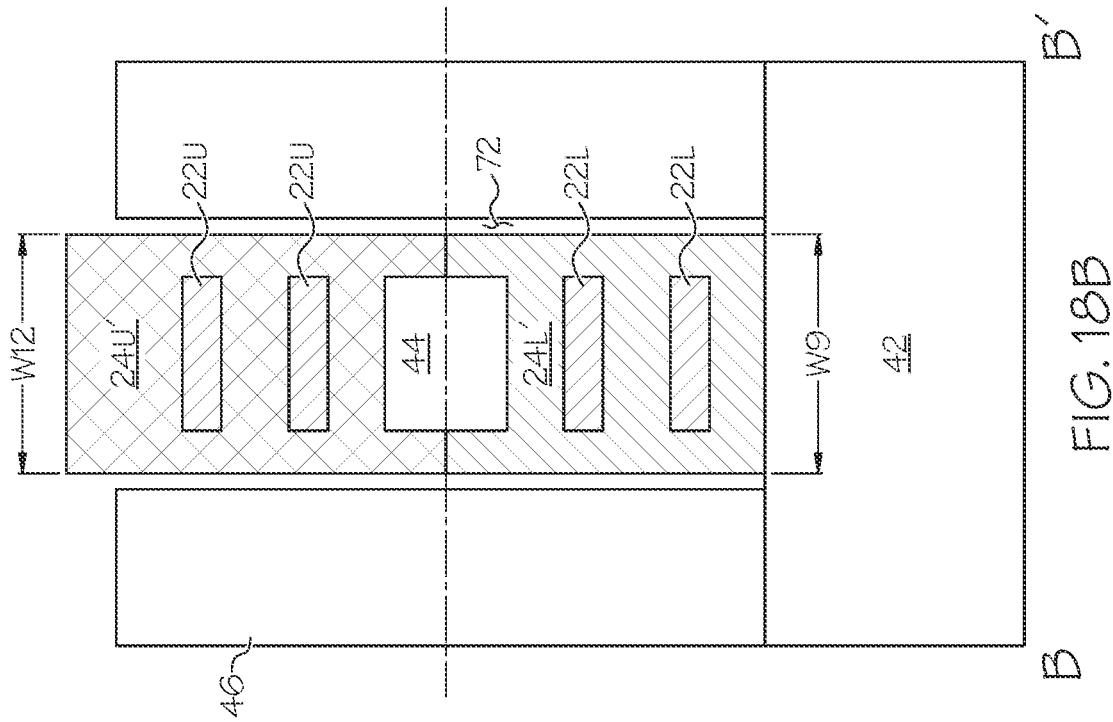
FIGS. 18A and 18B are cross-sectional views taken along the line A-A' and the line B-B' in FIG. 2A, respectively, illustrating a stacked integrated circuit device according to some embodiments of the present inventive concept.
Figure 18A:
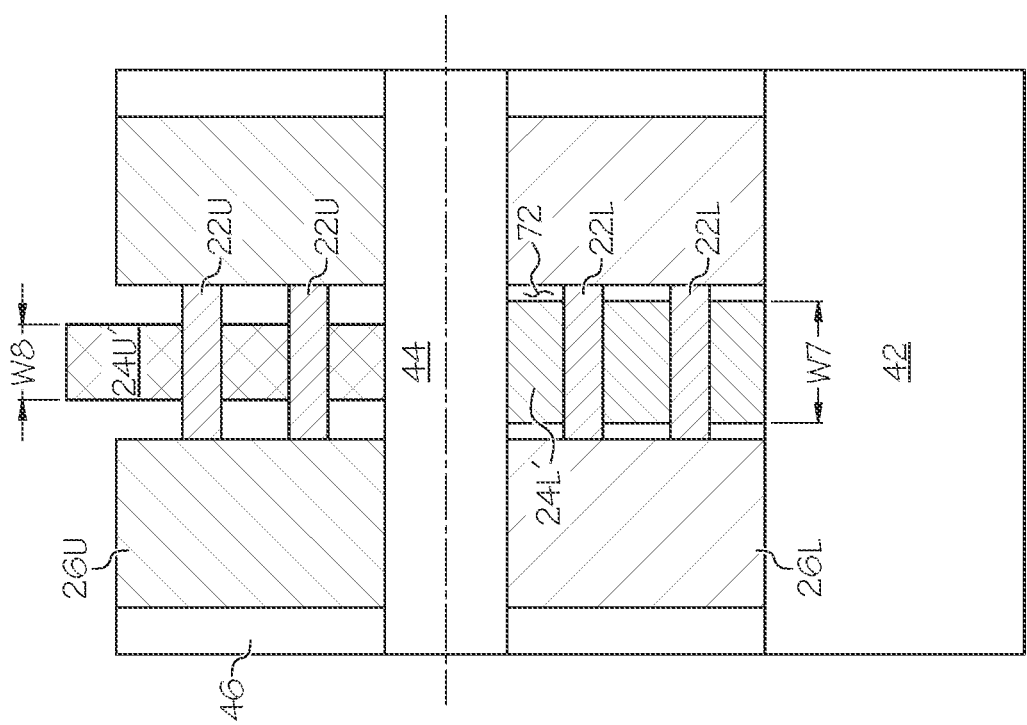

FIGS. 18A and 18B are cross-sectional views taken along the line A-A' and the line B-B' in FIG. 2A, respectively, illustrating a stacked integrated circuit device according to some embodiments of the present inventive concept.

The stacked integrated circuit device illustrated in FIGS. 18A and 18B may be formed by a method that includes the same or similar processes discussed with reference to FIGS. 13A, 13B, 14A and 14B, and then portions of the second spacer layer 64' formed on second sides of the opening 56, which are spaced apart from each other in the second horizontal direction, may be removed before forming an upper gate structure 24U'.

Referring to FIGS. FIGS. 18A and 18B, the upper gate structure 24U may have a twelfth width W12 in the second horizontal direction, which may be equal to the ninth width W9 of the lower gate structure 24L' in the second horizontal direction. The lower gate structure 24L' may have the seventh width W7 in the first horizontal direction, which is wider than an eighth width W8 of the upper gate structure 24U in the first horizontal direction.

Although example embodiments of the present inventive concept are illustrated as including an active region (e.g., lower active regions 22L and upper active regions 22U in FIGS. 7A and 7B) that includes multiple stacked layers, the present inventive concept can be applied to devices including various active regions (e.g., a fin-shaped active region, a quantum-dot active region).

Figure 19A:
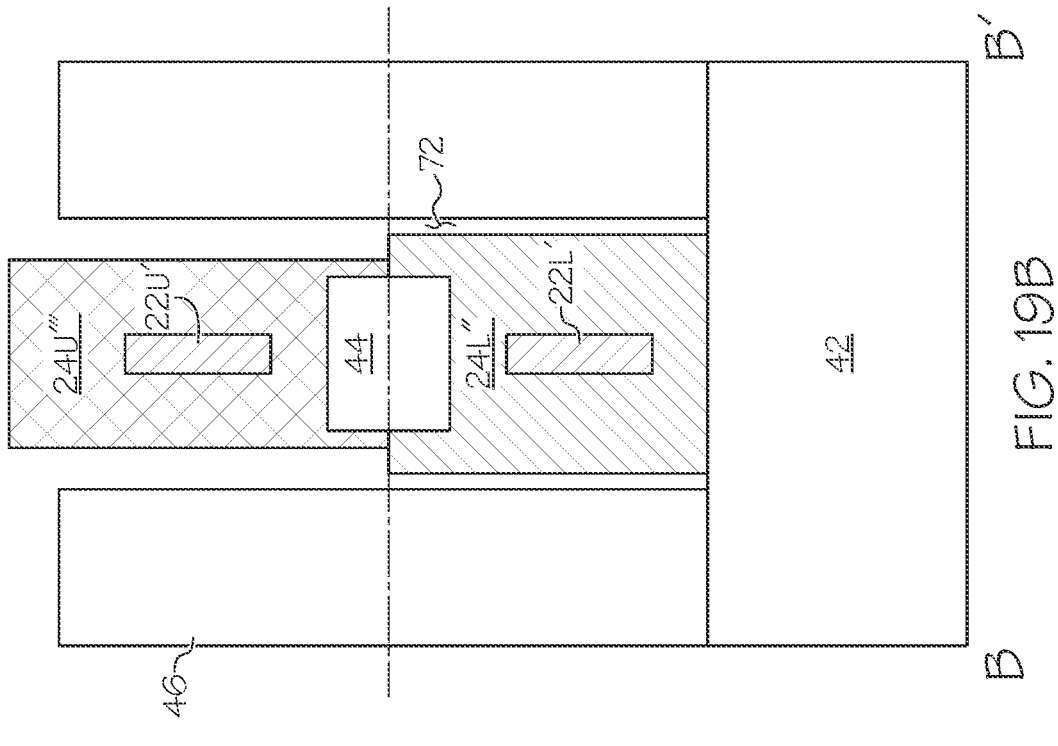
FIGS. 19A and 19B are cross-sectional views taken along the line A-A' and the line B-B' in FIG. 2A, respectively, illustrating a stacked integrated circuit device according to some embodiments of the present inventive concept.
Figure 19B:
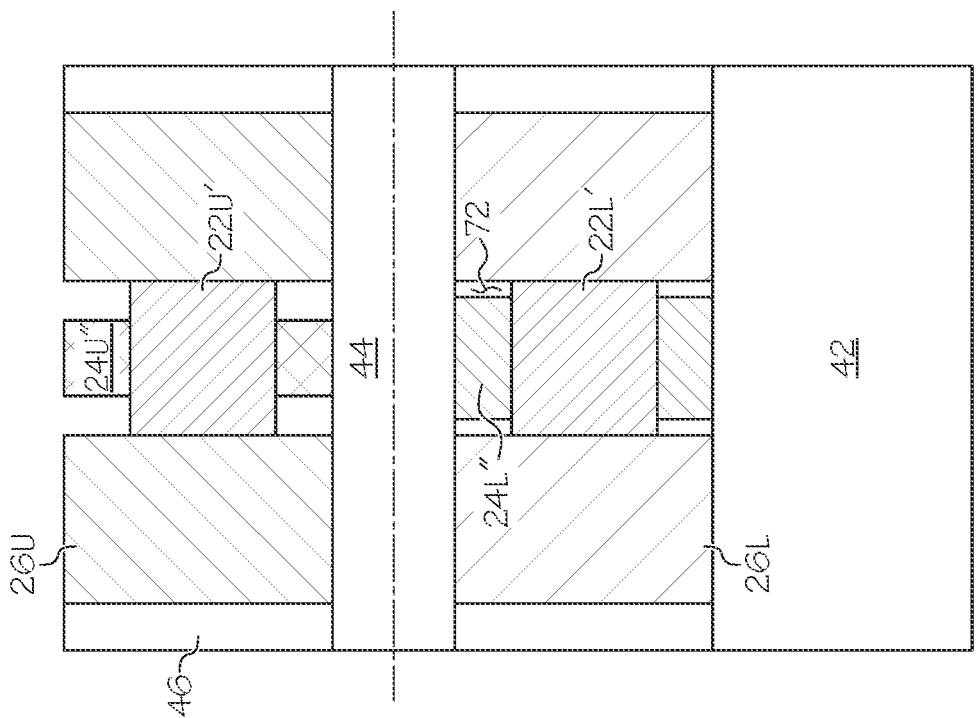

FIGS. 19A and 19B are cross-sectional views taken along the line A-A' and the line B-B' in FIG. 2A, respectively, illustrating a stacked integrated circuit device according to some embodiments of the present inventive concept. The stacked integrated circuit device illustrated in FIGS. 19A and 19B is the same or similar to that illustrated in FIGS. 7A and 7B except the configuration and shape of lower and upper active regions 22L' and 22U and lower and upper gate structure 24L" and 24U". Each of the lower and upper active regions 22L' and 22U may be a single layer having a fin-shape. The stacked integrated circuit device illustrated in FIGS. 19A and 19B may be formed by a method the same or similar to that discussed with reference to FIGS. 3A through 7B.

Example embodiments are described herein with reference to the accompanying drawings. Many different forms and embodiments are possible without deviating from the scope of the present inventive concept. Accordingly, the present inventive concept should not be construed as limited to the example embodiments set forth herein. Rather, these example embodiments are provided so that this disclosure will be thorough and complete and will convey the scope of the present inventive concept to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that although the terms first, second, etc. may be used herein to describe various elements, these elements should not be limited by these terms. These terms are only used to distinguish one element from another. Thus, a first element could be termed a second element without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents and shall not be restricted or limited by the foregoing detailed description.

What is claimed is:

1. An integrated circuit device comprising:
   an upper transistor on a substrate, the upper transistor comprising an upper active region, an upper gate structure on the upper active region, and first and second upper source/drain regions that are spaced apart from each other in a first horizontal direction and contact opposing side surfaces of the upper active region, respectively, wherein the first horizontal direction is parallel to an upper surface of the substrate; and
   a lower transistor between the substrate and the upper transistor, the lower transistor comprising a lower active region, a lower gate structure on the lower active region, and first and second lower source/drain regions that are spaced apart from each other in the first horizontal direction and contact opposing side surfaces of the lower active region, respectively,
   wherein the lower gate structure has a first width in the first horizontal direction, and the upper gate structure has a second width in the first horizontal direction,
   the lower gate structure has a third width in a second horizontal direction that is perpendicular to the first horizontal direction and is parallel to the upper surface of the substrate, and the upper gate structure has a fourth width in the second horizontal direction,
   wherein the first width is different from the second width, and the third width is different from the fourth width, and wherein an uppermost end of the lower gate structure is closer than a lowermost end of the upper gate structure to the substrate.

2. The integrated circuit device of claim 1, wherein the upper gate structure comprises an upper gate electrode on the upper active region, and the lower gate structure comprises a lower gate electrode on the lower active region, and
the upper gate electrode comprises a material different from the lower gate electrode.

3. The integrated circuit device of claim 2, wherein the first and second upper source/drain regions have a conductivity type different from a conductivity type of the first and second lower source/drain regions.

4. The integrated circuit device of claim 1, wherein
a difference between the first width and the second width is equal to a difference between the third width and the fourth width.

5. The integrated circuit device of claim 1, wherein the upper gate structure comprises an upper gate electrode on the upper active region, and the lower gate structure comprises a lower gate electrode on the lower active region, and
the upper gate electrode is electrically connected to the lower gate electrode.

6. The integrated circuit device of claim 1, wherein the upper active region comprises a plurality of first nanosheets stacked in a vertical direction that is perpendicular to the upper surface of the substrate, and
the lower active region comprises a plurality of second nanosheets stacked in the vertical direction.

7. An integrated circuit device comprising:
an upper transistor on a substrate, the upper transistor comprising an upper active region, an upper gate structure on the upper active region, and first and second upper source/drain regions that are spaced apart from each other in a first horizontal direction and contact opposing side surfaces of the upper active region, respectively, wherein the first horizontal direction is parallel to an upper surface of the substrate;
a lower transistor between the substrate and the upper transistor, the lower transistor comprising a lower active region, a lower gate structure on the lower active region, and first and second lower source/drain regions that are spaced apart from each other in the first horizontal direction and contact opposing side surfaces of the lower active region, respectively; and
an insulating layer between the upper active region and the lower active region, between the first upper source/drain region and the first lower source/drain region, and between the second upper source/drain region and the second lower source/drain region,
wherein the upper gate structure is connected to the lower gate structure,
wherein the lower gate structure has a first width in a second horizontal direction that is perpendicular to the first horizontal direction and is parallel to the upper surface of the substrate, and the upper gate structure has a second width in the second horizontal direction,
wherein the second width is wider than the first width,
wherein the upper gate structure and the lower gate structure overlap the insulating layer in the second horizontal direction, and
wherein an uppermost end of the lower gate structure is closer than a lowermost end of the upper gate structure to the substrate.

8. The integrated circuit device of claim 7, wherein the upper gate structure comprises an upper gate electrode on the upper active region, and the lower gate structure comprises a lower gate electrode on the lower active region, and
the upper gate electrode comprises a material different from the lower gate electrode.

9. The integrated circuit device of claim 8, wherein the first and second upper source/drain regions have a conductivity type different from a conductivity type of the first and second lower source/drain regions.

* * * * *